(12) United States Patent
Chang

(10) Patent No.: US 12,131,705 B2
(45) Date of Patent: Oct. 29, 2024

(54) GATE DRIVER AND ELECTROLUMINESCENT DISPLAY APPARATUS INCLUDING THE SAME

(71) Applicant: LG Display Co., Ltd., Seoul (KR)

(72) Inventor: Sung Wook Chang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/200,463

(22) Filed: May 22, 2023

(65) Prior Publication Data

US 2023/0298530 A1 Sep. 21, 2023

Related U.S. Application Data

(63) Continuation of application No. 17/742,011, filed on May 11, 2022, now Pat. No. 11,694,629.

(60) Provisional application No. 63/187,927, filed on May 12, 2021.

(51) Int. Cl.
*G09G 3/3233* (2016.01)
*G09G 3/3266* (2016.01)

(52) U.S. Cl.
CPC ..... *G09G 3/3266* (2013.01); *G09G 2300/043* (2013.01)

(58) Field of Classification Search
CPC ........... G09G 3/3266; G09G 2300/043; G09G 3/3291
See application file for complete search history.

(56) References Cited

U.S. PATENT DOCUMENTS

| | | | |
|---|---|---|---|
| 8,477,094 B2 | 7/2013 | Jung et al. | |
| 9,269,289 B2 | 2/2016 | Gao et al. | |
| 9,620,240 B2 | 4/2017 | So et al. | |
| 9,837,017 B2 | 12/2017 | Park et al. | |
| 10,410,734 B2 | 9/2019 | Kim et al. | |
| 10,629,133 B2 | 4/2020 | Kim et al. | |
| 10,991,302 B1 * | 4/2021 | Park | G09G 3/3291 |

(Continued)

FOREIGN PATENT DOCUMENTS

| | | |
|---|---|---|
| CN | 102117659 A | 7/2011 |
| CN | 102867475 A | 1/2013 |

(Continued)

OTHER PUBLICATIONS

China National Intellectual Property Administration, Office Action, Chinese Patent Application No. 202210521065.5, Jun. 28, 2024, 20 pages.

(Continued)

*Primary Examiner* — Abdul-Samad A Adediran
(74) *Attorney, Agent, or Firm* — Fenwick & West LLP

(57) ABSTRACT

A gate driver includes a plurality of gate stages. Each of the plurality of gate stages includes a carry generating circuit outputting a second carry signal having a phase which is later than a phase of a first carry signal, on the basis of a first clock signal and a second clock signal having different phases and a scan generating circuit outputting a scan signal having a phase which differs from phases of the first and second carry signals, on the basis of the first clock signal, the second clock signal, and the first carry signal. Each of the first clock signal, the second clock signal, the first carry signal, and the second carry signal may be a P-type pulse, and the scan signal may be an N-type pulse.

20 Claims, 22 Drawing Sheets

(56) References Cited

U.S. PATENT DOCUMENTS

| | | |
|---|---|---|
| 11,270,650 B2 | 3/2022 | Seo et al. |
| 2008/0117157 A1 | 5/2008 | Hwang |
| 2011/0157124 A1 | 6/2011 | Jung et al. |
| 2014/0071104 A1 | 3/2014 | Gao et al. |
| 2014/0354523 A1 | 12/2014 | So et al. |
| 2017/0110050 A1 | 4/2017 | Park et al. |
| 2018/0096733 A1 | 4/2018 | Kim et al. |
| 2018/0350315 A1 | 12/2018 | Zhang et al. |
| 2019/0035322 A1 | 1/2019 | Kim et al. |
| 2020/0243150 A1 | 7/2020 | Chen et al. |
| 2020/0387282 A1 | 12/2020 | Huang |
| 2020/0394962 A1 | 12/2020 | Seo et al. |
| 2021/0193000 A1 | 6/2021 | Ma et al. |
| 2021/0335193 A1 | 10/2021 | Cong et al. |
| 2022/0398968 A1 | 12/2022 | Wang et al. |

FOREIGN PATENT DOCUMENTS

| | | |
|---|---|---|
| CN | 106601192 A | 4/2017 |
| CN | 109308864 A | 2/2019 |
| KR | 10-2014-0140737 A | 12/2014 |
| KR | 10-2017-0045441 A | 4/2017 |
| KR | 10-2018-0037778 A | 4/2018 |
| KR | 10-2020-0142160 A | 12/2020 |

OTHER PUBLICATIONS

Korean Intellectual Property Office, Notice of Allowance, Korean Patent Application No. 10-2022-0058512, Aug. 29, 2024, 10 pages.

\* cited by examiner

GATE DRIVER AND ELECTROLUMINESCENT DISPLAY APPARATUS INCLUDING THE SAME

CROSS-REFERENCE TO RELATED APPLICATIONS

This application is a continuation patent application of U.S. application Ser. No. 17/742,011, filed on May 11, 2022, which claims the benefit of U.S. Provisional Patent Application No. 63/187,927 filed on May 12, 2021, all of which are hereby incorporated by reference as if fully set forth herein.

BACKGROUND

Field

The present disclosure relates to a gate driver and an electroluminescent display apparatus including the same.

Discussion of the Related Art

Electroluminescent display apparatuses include pixels arranged in a matrix form and supply the pixels with image data synchronized with a scan signal to adjust luminance of the pixels. Electroluminescent display apparatuses generate the scan signal by using a gate driver including a plurality of gate stages. Each gate stage of the gate driver is connected to a gate line of a display panel. Each gate stage includes a plurality of transistors and outputs the scan signal, swings between a scan-on voltage and a scan-off voltage, to the gate line of the display panel.

The scan signal should be applied to each pixel without distortion. When the scan signal is distorted, abnormal image data may be sampled, and due to this, an image quality defect may occur. Also, a configuration of a gate stage should be simplified. When a configuration of the gate stage is complicated, it is difficult to reduce a bezel of electroluminescent display apparatuses.

SUMMARY

To overcome the aforementioned problem of the related art, the present disclosure may provide a gate driver and an electroluminescent display apparatus including the same, in which a configuration of a gate stage is simplified and distortion of a scan signal is reduced.

To achieve these objects and other advantages and in accordance with the purpose of the disclosure, as embodied and broadly described herein, in one embodiment, a gate driver includes a plurality of gate stages. Each of the plurality of gate stages includes a carry generating circuit outputting a second carry signal having a phase which is later than a phase of a first carry signal, on the basis of a first clock signal and a second clock signal having different phases and the first carry signal synchronized with a pulse of one of the first clock signal and the second clock signal and a scan generating circuit outputting a scan signal having a phase which differs from phases of the first and second carry signals, on the basis of the first clock signal, the second clock signal, and the first carry signal. Each of the first clock signal, the second clock signal, the first carry signal, and the second carry signal is a P-type pulse where a voltage of a pulse interval is lower than a voltage of a non-pulse interval, and the scan signal is an N-type pulse where the voltage of the pulse interval is higher than the voltage of the non-pulse interval.

In another aspect of the present disclosure, an electroluminescent display apparatus includes a gate line, a pixel including an N-type transistor including a gate electrode connected to the gate line, and the gate driver outputting the scan signal to the gate line.

In one embodiment, a gate driver includes a plurality of gate stages for driving a plurality of gate lines of a display panel. Each gate stage may be connected to a respective gate line connected to one or more transistors in the display panel. A gate stage may include a carry generating circuit including a set of transistors of a first type. The carry generating circuit may be configured to receive a first clock signal, a second clock signal, and a first carry signal from a previous gate stage and generate a second carry signal for a next gate stage. A pulse interval of the second carry signal may be later than a pulse interval of the first carry signal. The gate stage may also include a scan generating circuit including another set of transistors of the first type. The scan generating circuit may be configured to receive the first clock signal, the second clock signal, and the first carry signal and generate a scan signal for supply to the one or more transistors of a second type in the display panel. The pulse intervals of the first carry signal, the first clock signal, and the second clock signal are configured to turn on one or more transistors of the first type in the carry generating circuit and the scan generating circuit at a first logic state, and a pulse interval of the scan signal may be configured to turn on the one or more transistors of the second type in the display panel at a second logic state.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

DETAILED DESCRIPTION

Figure 1:
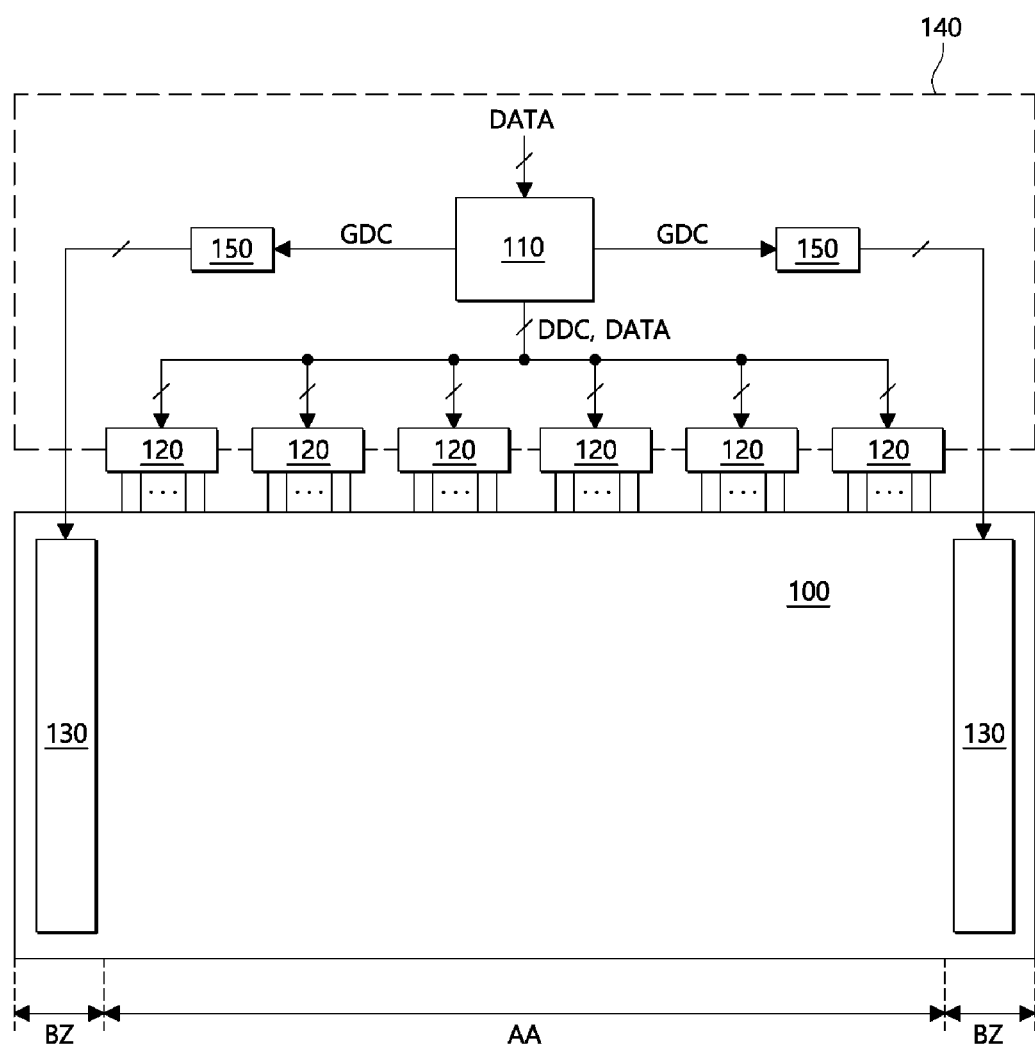
FIG. 1 is a diagram illustrating an electroluminescent display apparatus according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

The shapes, sizes, ratios, angles, numbers and the like disclosed in the drawings for description of various embodiments of the present disclosure to describe embodiments of the present disclosure are merely exemplary and the present disclosure is not limited thereto. Like reference numerals refer to like elements throughout. Throughout this specification, the same elements are denoted by the same reference numerals. As used herein, the terms "comprise", "having," "including" and the like suggest that other parts can be added unless the term "only" is used. As used herein, the singular forms "a", "an", and "the" are intended to include the plural forms as well, unless context clearly indicates otherwise.

Elements in various embodiments of the present disclosure are to be interpreted as including margins of error even without explicit statements.

In describing a position relationship, for example, when a position relation between two parts is described as "on~", "over~", "under~", and "next~", one or more other parts may be disposed between the two parts unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In embodiments of the present disclosure, a transistor described herein may include a three-electrode element including a gate, a source, and a drain. The source and the drain of the transistor may switch therebetween on the basis of a voltage applied thereto. In the following description, therefore, one of a source and a drain will be described as a first electrode, and the other of the source and the drain will be described as a second electrode.

Hereinafter, embodiments of the present disclosure will be described in detail with reference to the accompanying drawings. In the following embodiments, as an example of an electroluminescent display apparatus, an organic light emitting display apparatus including an organic light emitting material will be mainly described. However, the inventive concept is not limited to an organic light emitting display apparatus and may be applied to an inorganic light emitting display apparatus including an inorganic light emitting material.

Figure 2:
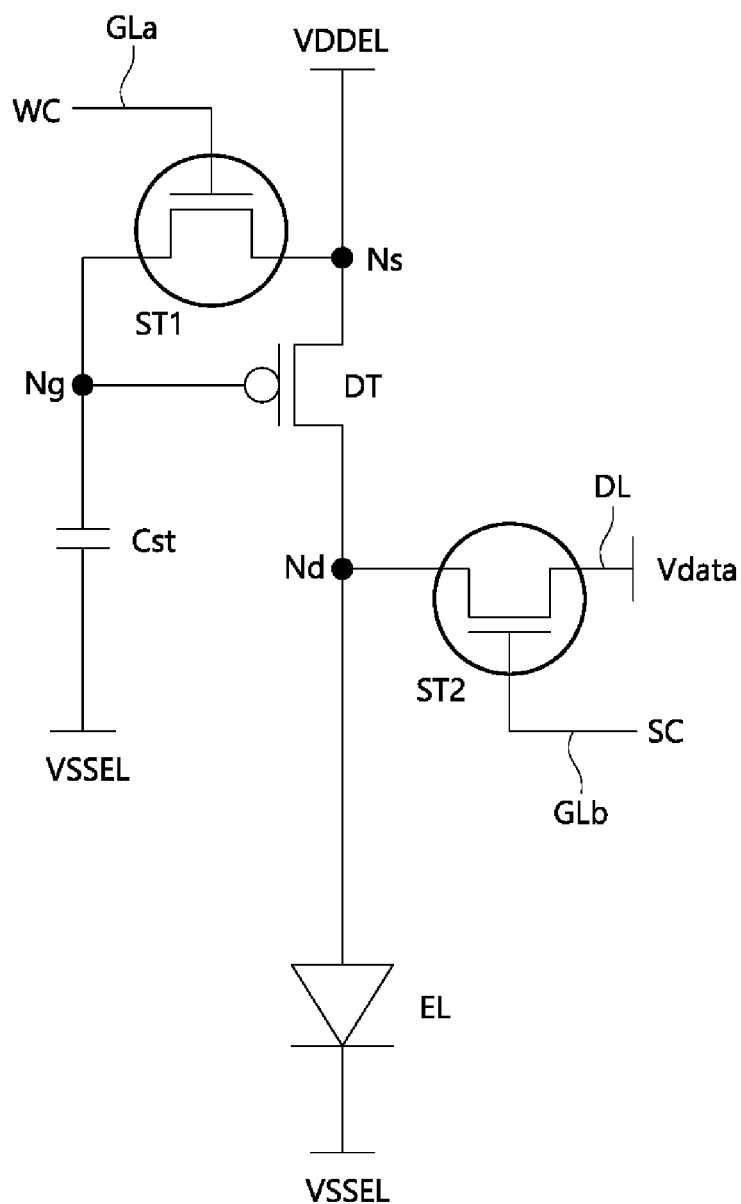
FIG. 2 is a diagram schematically illustrating an equivalent circuit of a pixel provided in a display panel according to an embodiment of the present disclosure.
Figure 3:
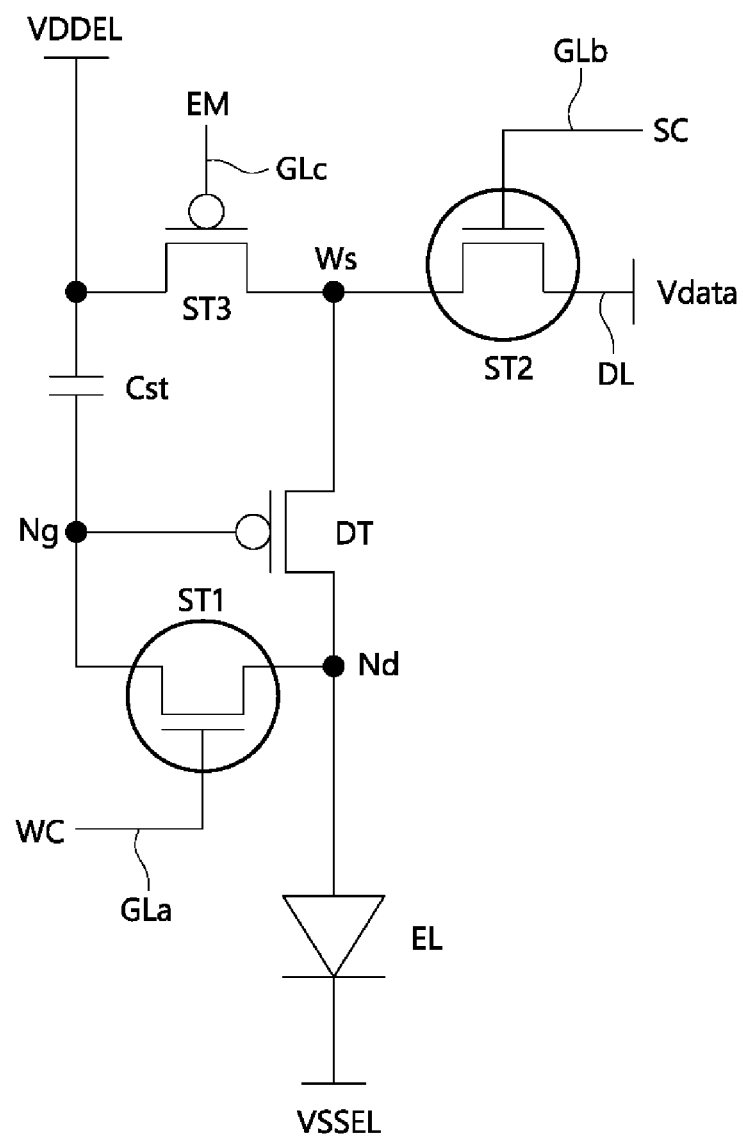
FIG. 3 is another diagram schematically illustrating an equivalent circuit of a pixel provided in a display panel according to an embodiment of the present disclosure.
Figure 4:
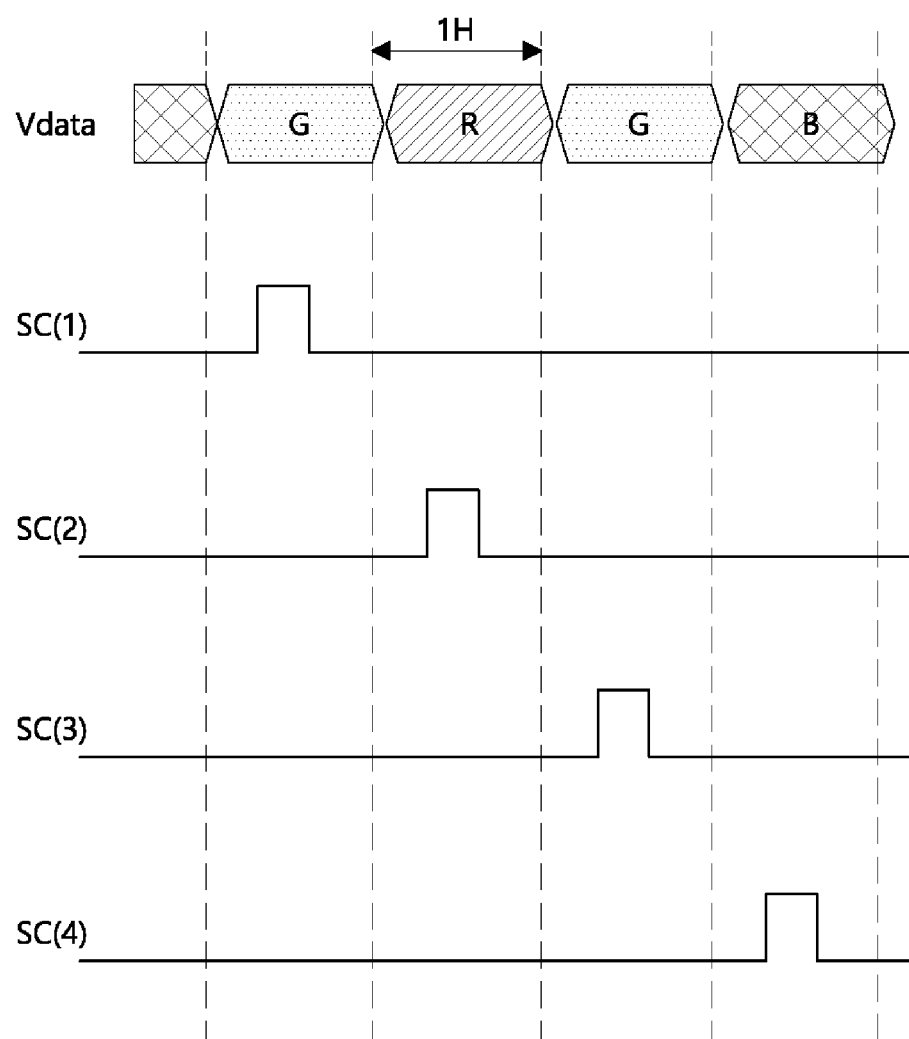
FIG. 4 is a diagram illustrating an N-type scan signal applied to a pixel of FIG. 2 or 3 according to an embodiment of the present disclosure.

FIG. 1 is a diagram illustrating an electroluminescent display apparatus according to an embodiment of the present disclosure. FIG. 2 is a diagram schematically illustrating an equivalent circuit of a pixel provided in a display panel. FIG. 3 is another diagram schematically illustrating an equivalent circuit of a pixel provided in a display panel. FIG. 4 is a diagram illustrating an N-type scan signal applied to a pixel of FIG. 2 or 3.

Referring to FIGS. 1 to 4, the electroluminescent display apparatus according to an embodiment of the present disclosure may include a display panel 100, a timing controller 110, a data driver 120, a gate driver 130, and a level shifter 150.

Referring to FIG. 1, a pixel array may be disposed in a display area AA of the display panel 100. Pixels PXL connected to a data line DL and gate lines Gla, GLb, and GLc may be arranged in a matrix form in the pixel array. A plurality of horizontal pixel lines may be provided in the pixel array, and a plurality of pixels PXL which are horizontally adjacent to one another and are connected to the same gate line may be arranged in each horizontal pixel line. Here, a horizontal pixel line may denote a set of pixels of one line implemented by pixels PXL horizontally adjacent to one another. A set of pixels of one line may be simultaneously driven by the same gate signal SC or WC. Power lines which transfer a high level pixel power VDDEL and a low level pixel power VSSEL to pixels PXL may be included in the pixel array.

Each of pixels PXL may be designed in a structure optimized for low speed driving. Because a refresh interval of image data increases in low speed driving, data voltages Vdata charged into the pixels PXL may not be maintained at a target level and may be leaked. In order to decrease the leakage of the data voltage Vdata, some transistors included in the pixel PXL may each be implemented as an oxide thin film transistor (TFT) which is good in off-current characteristic, and the other transistor of the pixel PXL may be implemented as a low temperature polysilicon (LTPS) TFT.

As in FIGS. 2 and 3, each of the pixels PXL may include a driving transistor DT and an organic light emitting diode EL. Each pixel PXL may further include a compensation circuit for compensating for an electrical characteristic change of the driving transistor DT. The compensation circuit may be implemented with a plurality of switching transistors and at least one capacitor. The compensation circuit may reflect a threshold voltage of the driving transistor DT in a gate-source voltage of the driving transistor DT in pixel driving, and thus, may perform compensation so that a pixel current flowing in the driving transistor DT is not affected by a threshold voltage variation of the driving transistor DT.

The compensation circuit may be implemented as a source follower type or a diode connection type.

A pixel PXL of the source follower type, as in FIG. 2, may include a first switching transistor ST1 connected between a gate and a source (Ng-Ns) of a driving transistor DT, a second switching transistor ST2 connected between a drain Nd of the driving transistor DT and a data line DL, and a storage capacitor Cst connected to a gate Ng of the driving transistor DT. The first switching transistor ST1 may be turned on based on a first gate signal WC supplied through a first gate line GLa, and the second switching transistor ST2 may be turned on based on a second gate signal SC supplied through a second gate line GLb.

A pixel PXL of the diode connection type, as in FIG. 3, may include a first switching transistor ST1 connected between a gate and a source (Ng-Nd) of a driving transistor DT, a second switching transistor ST2 connected between a source Ns of a driving transistor DT and a data line DL, a storage capacitor Cst connected to a gate Ng of the driving transistor DT, and a third switching transistor ST3 connected between the storage capacitor Cst and the source Ns of the driving transistor DT. The first switching transistor ST1 may be turned on based on a first gate signal WC supplied through a first gate line GLa, the second switching transistor ST2 may be turned on based on a second gate signal SC supplied through a second gate line GLb, and the third switching transistor ST3 may be turned on based on a third gate signal EM supplied through a third gate line GLc.

In FIGS. 2 and 3, the first and second switching transistors ST1 and ST2 may each be implemented an N-type oxide TFT, for decreasing the leakage of the data voltage Vdata and performing an accurate compensation operation. Furthermore, the driving transistor DT and the third switching transistor ST3 may be implemented as a P-type or N-type LTPS TFT which is high in electron mobility, but are not limited thereto.

The pixels PXL may include an R pixel for implementing red, a G pixel for implementing green, and a B pixel for implementing blue. The R, G, and B pixels PXL may be repeatedly and alternately arranged in one horizontal pixel line.

The second gate signal SC, as in FIG. 4, may determine a charging time of each of data voltages Vdata which are to be supplied to the R, G, and B pixels PXL. The second gate signal SC may need an on time (or a pulse interval) which is less than a one horizontal period 1H. When an on time of the second gate signal SC is greater than one horizontal period 1H, because an abnormal data voltage Vdata is sampled, an image defect may occur. Hereinafter, for convenience of description, the second gate signal may be referred to as a scan signal, and the first and third gate signals may be referred to as a gate signal.

Referring to FIG. 1, the data driver 120 may receive image data DATA and a source timing control signal DDC from the timing controller 110. In response to the source timing control signal DDC, the data driver 120 may convert the image data DATA into a gamma compensation voltage to generate a data voltage Vdata and may supply the data voltage Vdata to data lines of the display panel 100 on the basis of a supply timing of the scan signal. The data driver 120 may be connected to data lines of the display panel 100 through a chip-on glass (COG) process or a tape automated bonding (TAB) process. The data driver 120 may be implemented with one or more integrated circuits (ICs).

Referring to FIG. 1, the level shifter 150 may generate the gate timing control signal GDC for driving a switching transistor of a pixel on the basis of an on/off control clock having a transistor-transistor-logic (TTL) level which is input from the timing controller 110. The gate timing control signal GDC may include a start signal and a clock signal, which swing between an on level and an off level. The level shifter 150 may supply the gate timing control signal GDC to the gate driver 130.

Referring to FIG. 1, the gate driver 130 may operate based on the gate timing control signal GDC input from the level shifter 150 and may generate the scan signal and the gate signal needed for driving of the pixel PXL. Also, the gate driver 130 may supply the scan signal and the gate signal to different gate lines.

The gate driver 130 may be directly provided on a lower substrate of the display panel 100 on the basis of a gate driver in panel (GIP) type. The gate driver 130 may be provided in a non-display area (i.e., a bezel area BZ) outside the display area AA in the display panel 100. In the GIP type, the level shifter 150 may be mounted on a printed circuit board (PCB) 140 along with the timing controller 110.

Referring to FIG. 1, the timing controller 110 may be connected to an external host system on the basis of various interface types known to those skilled in the art. The timing controller 110 may receive the image data DATA from the host system and may correct the image data DATA by using an image processing circuit included therein, and then, may transfer corrected image data to the data driver 120.

The timing controller 110 may receive a timing signal such as a vertical synchronization signal Vsync, a horizontal synchronization signal Hsync, a data enable signal DE, and a main clock MCLK and may generate an on/off control clock needed for the source timing control signal DDC and the gate timing control signal GDC on the basis of the timing signal.

Figure 5:
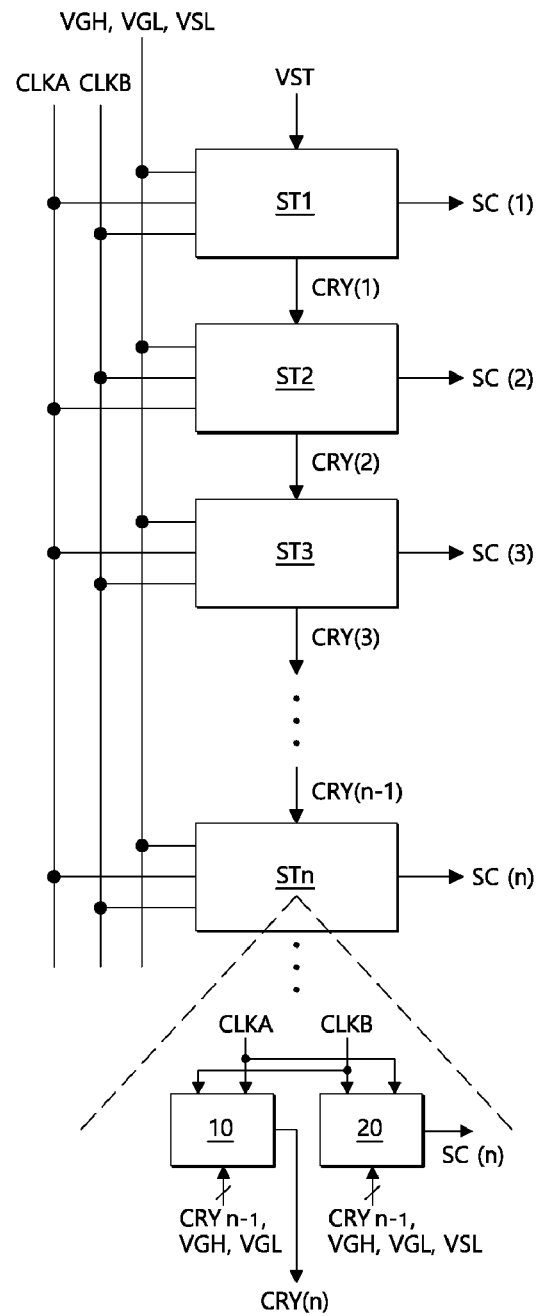
FIG. 5 is a diagram illustrating a connection configuration between gate stages included in a gate driver of FIG. 1 according to an embodiment of the present disclosure.
Figure 6:
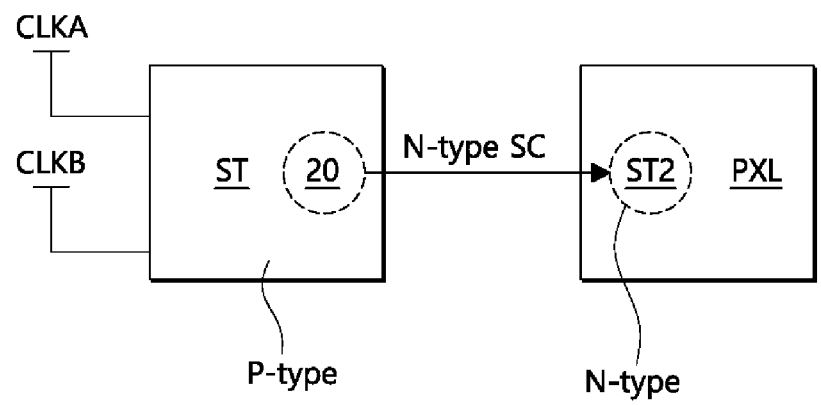
FIG. 6 is a diagram illustrating a connection concept of a gate stage and a pixel according to an embodiment of the present disclosure.
Figure 7A:
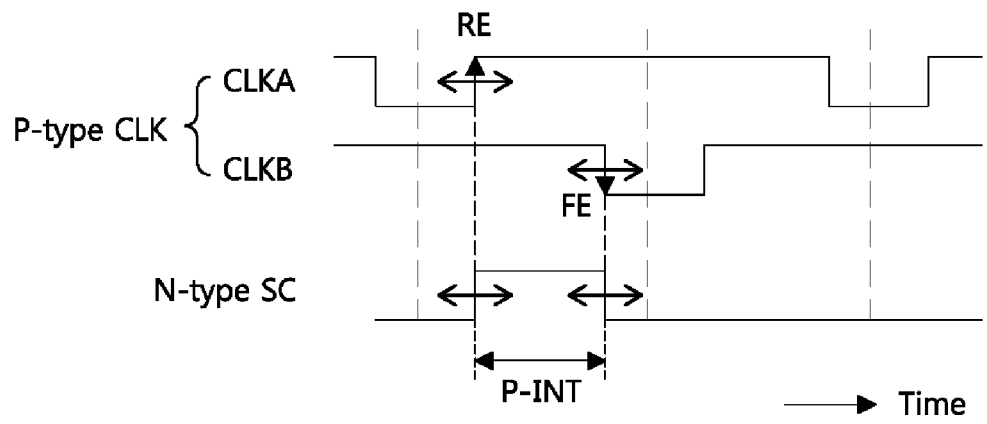
FIG. 7A is a diagram illustrating a phase relationship between first and second clock signals and a scan signal in an odd-numbered gate stage according to an embodiment of the present disclosure.
Figure 7B:
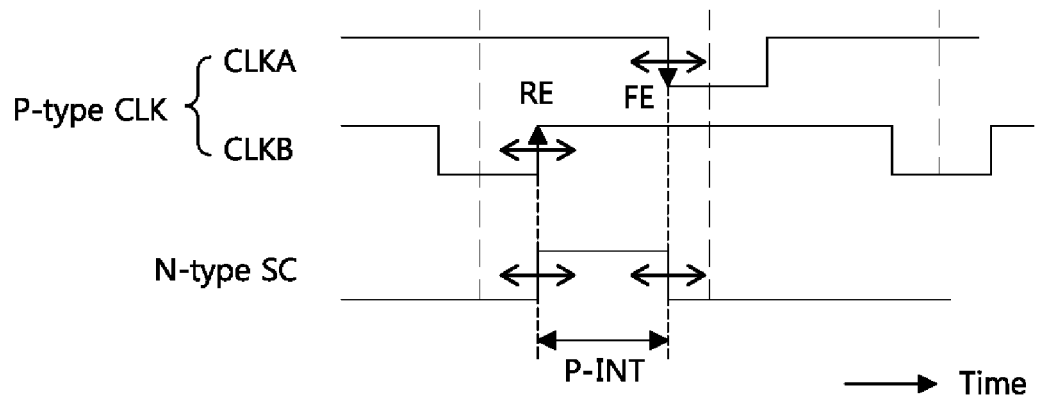
FIG. 7B is a diagram illustrating a phase relationship between first and second clock signals and a scan signal in an even-numbered gate stage according to an embodiment of the present disclosure.

FIG. 5 is a diagram illustrating a connection configuration between gate stages included in a gate driver of FIG. 1. FIG. 6 is a diagram illustrating a connection concept of a gate stage and a pixel according to an embodiment of the present disclosure. FIG. 7A is a diagram illustrating a phase relationship between first and second clock signals and a scan signal in an odd-numbered gate stage. FIG. 7B is a diagram illustrating a phase relationship between first and second clock signals and a scan signal in an even-numbered gate stage.

Referring to FIG. 5, in the gate driver 130, a plurality of gate stages ST1 to STn may be connected to one another in a cascading type to configure a gate shift register. The gate stages ST1 to STn of FIG. 5 may output scan signals SC(1) to SC(n) having phases which are sequentially delayed. Gate signals supplied to the pixels PXL of FIGS. 2 and 3 may be generated by the other gate stages included in the gate driver 130. The following embodiments relate to the gate stages ST1 to STn for generating the scan signals SC(1) to SC(n).

A first gate stage ST1 of the gate stages ST1 to STn may start to operate based on a start signal VST. Also, each of the gate stages ST2 to STn except a first gate stage may start to operate based on a carry output (i.e., one of carry signals CRY(1) to CRY(n−1)) of a previous gate stage which has operated prior thereto.

Each gate stage ST may be supplied with a gate high voltage VGH and a gate low voltage VGL through different power supply lines. Each gate stage ST may be further supplied with a gate middle voltage VSL through another power supply line. The gate high voltage VGH may be higher than the gate low voltage VGL. The gate middle voltage VSL may be lower than the gate high voltage VGH and may be higher than the gate low voltage VGL.

Each gate stage ST may be supplied with two-phase clock signals CLKA and CLKB through different clock supply lines. The two-phase clock signals CLKA and CLKB may have different phases.

Each gate stage ST may include a plurality of first input terminals receiving a first clock signal and a plurality of second input terminals receiving a second clock signal. In an odd-numbered gate stage, the clock signal CLKA may be input as a first clock signal to the plurality of first input terminals, and the clock signal CLKB may be input as a second clock signal to the plurality of second input terminals. On the other hand, in an even-numbered gate stage, the clock signal CLKB may be input as the first clock signal to the plurality of first input terminals, and the clock signal CLKA may be input as the second clock signal to the plurality of second input terminals.

Each gate stage ST may include a carry generating circuit 10 and a scan generating circuit 20. The carry generating circuit 10 may generate a carry signal CRY synchronized with one of the first clock signal and the second clock signal, and the scan generating circuit 20 may generate a scan signal SC having a phase which differs from that of the carry signal CRY. The scan generating circuit 20 may output the scan signal SC to a scan output node connected to one gate line of the display panel. The carry generating circuit 10 may output the carry signal CRY to a carry output node connected to a next stage. Because the carry output node of the carry generating circuit 10 is not connected to the gate line of the display panel, the carry signal CRY may be independent of a panel load. That is, the carry signal CRY may not be distorted by the panel load. As a result, an operation start time of the scan generating circuit 20 based on the carry signal CRY of a previous stage may be stabilized.

Because the carry generating circuit 10 and the scan generating circuit 20 share the two-phase clock signals CLKA and CLKB, it may be sufficient that the number of clock supply lines needed for the gate stages ST1 and STn is two. When the number of clock supply lines is small, a size of a bezel area needed for implementing the gate driver 130 may decrease.

In one embodiment, the carry generating circuit 10 may include a set of transistors of a first type. The carry generating circuit 10 is configured to receive the carry signal CRY of a previous stage, a first clock signal, and a second clock signal and generate a carry signal CRY for the next stage. The scan generating circuit 20 may include another set of transistors of a second type. The scan generating circuit 20 is configured to receive the first clock signal, the second clock signal, and the carry signal CRY from the previous stage and generate scan signal SC to a scan output node.

In one embodiment, pulse intervals of the carry signal CRY, the first clock signal, and the second clock signal are configured to turn on one or more transistors of the first type in the carry generating circuit 10 and the scan generating circuit 20 at a first logic state, and a pulse interval of the scan signal SC is configured to turn on one or more transistors of a second type in the display panel at a second logic state.

Specifically, the carry generating circuit 10 and the scan generating circuit 20 of each gate stage ST may be implemented using a P-type LTPS TFT process where a relative process step is simple, and thus, the manufacturing cost may be reduced. Thus, the carry generating circuit 10 may include at least a set of transistors that are P-type TFT's and the scan generating circuit 20 may include at least another set of transistors that are P-type TFT's. In a P-type LTPS TFT, unlike an N-type LTPS TFT, it may not be required to implement a lightly doped drain (LDD) structure through an additional mask process. The reason may be because a leakage current is not large in an N+ boundary surface despite there being no LDD structure as a plurality of carriers are holes and holes are lower in electron mobility than electrons in the P-type LTPS TFT. Accordingly, in the P-type LTPS TFT, it may not be required to add a mask process for forming the LDD structure, and thus, a process step may be simplified based thereon.

Referring to FIG. 6, in order to drive a P-type LTPS TFT of each gate stage ST, each of the two-phase clock signals CLKA and CLKB and the carry signal CRY may be a P-type pulse where a voltage of a pulse interval is lower than a voltage of a non-pulse interval. Thus, each of the two-phase clock signals CLKA and CLKB and the carry signal CRY may be configured to turn on P-type transistors at a first logic state where, for example, a voltage of a pulse interval is lower than a voltage of a non-pulse interval.

Furthermore, an N-type oxide TFT (ST2 of FIGS. 2 and 3) included in the pixel PXL may need an N-type scan signal SC, for driving. To this end, the scan generating circuit 20 included in each gate stage ST may output the scan signal SC having an N-type pulse where a voltage of a pulse interval is higher than a voltage of a non-pulse interval. Thus, the scan signal SC may be configured to turn on N-type transistors at a second logic state where, for example, a voltage of a pulse interval is higher than a voltage of a non-pulse interval.

Moreover, while the remainder of the specification primarily describes an example where transistors of the first type are P-type TFT's and transistors of the second type are N-type TFT's, embodiments are not limited hereto, and it is appreciated that the disclosure can apply to any other configuration where gate stages in a gate driver are supplying scan signals SC based on transistors of a first type to transistors of a second type in the display panel.

The scan generating circuit 20 may receive P-type two-phase clock signals CLKA and CLKB needed for an operation of the carry generating circuit 10 to output an N-type scan signal SC. Because the scan generating circuit 20 does not need to receive an additional clock signal other than P-type two-phase clock signals CLKA and CLKB in order to output the N-type scan signal SC, a circuit configuration of the scan generating circuit 20 may be simplified.

A pulse width of the N-type scan signal SC output from the scan generating circuit 20 may be determined based on a pulse width of each of a first clock signal and a second clock signal constituting the P-type two-phase clock signals CLKA and CLKB. The pulse width of the N-type scan signal SC output from the scan generating circuit 20 may be determined to be inversely proportional to the pulse width of each of the first clock signal and the second clock signal constituting the P-type two-phase clock signals CLKA and CLKB. The pulse width of the N-type scan signal SC may be adjusted based on a design model and a design spec in one horizontal period. In this case, when a pulse width of each of the P-type two-phase clock signals CLKA and CLKB is adjusted, the pulse width of the N-type scan signal SC may also be adjusted based thereon, and thus, a model and a spec may be easily changed.

A pulse interval (a high voltage interval) of the N-type scan signal SC output from the scan generating circuit 20 may be the same as an overlap interval between a non-pulse interval (a high voltage interval) of the first clock signal of the P-type two-phase clock signals CLKA and CLKB and a non-pulse interval (a high voltage interval) of the second clock signal of the P-type two-phase clock signals CLKA and CLKB.

In detail, as in FIG. 7A, a pulse interval (a high voltage interval) of the N-type scan signal SC output from the scan generating circuit 20 of an odd-numbered stage may be a first interval P-INT between a rising edge RE of a first clock signal CLKA of the P-type two-phase clock signals CLKA and CLKB and a falling edge FE of a second clock signal CLKB of the P-type two-phase clock signals CLKA and CLKB. In this case, the rising edge RE of the first clock signal CLKA may be adjacent to the falling edge FE of the second clock signal CLKB.

Moreover, as in FIG. 7B, a pulse interval (a high voltage interval) of the N-type scan signal SC output from the scan generating circuit 20 of an even-numbered stage may be a second interval P-INT between a rising edge RE of a first clock signal CLKB of the P-type two-phase clock signals CLKA and CLKB and a falling edge FE of a second clock signal CLKA of the P-type two-phase clock signals CLKA and CLKB. In this case, the rising edge RE of the first clock signal CLKB may be adjacent to the falling edge FE of the second clock signal CLKA.

Hereinafter, detailed embodiments of the carry generating circuit 10 and the scan generating circuit 20 configuring a gate stage ST will be described. In the following embodiments, a clock signal CLKA will be described as a first clock signal, and a clock signal CLKB will be described as a second clock signal. However, the inventive concept may be applied to a case where a clock signal CLKB is a first clock signal and a clock signal CLKA is a second clock signal.

Figure 8:
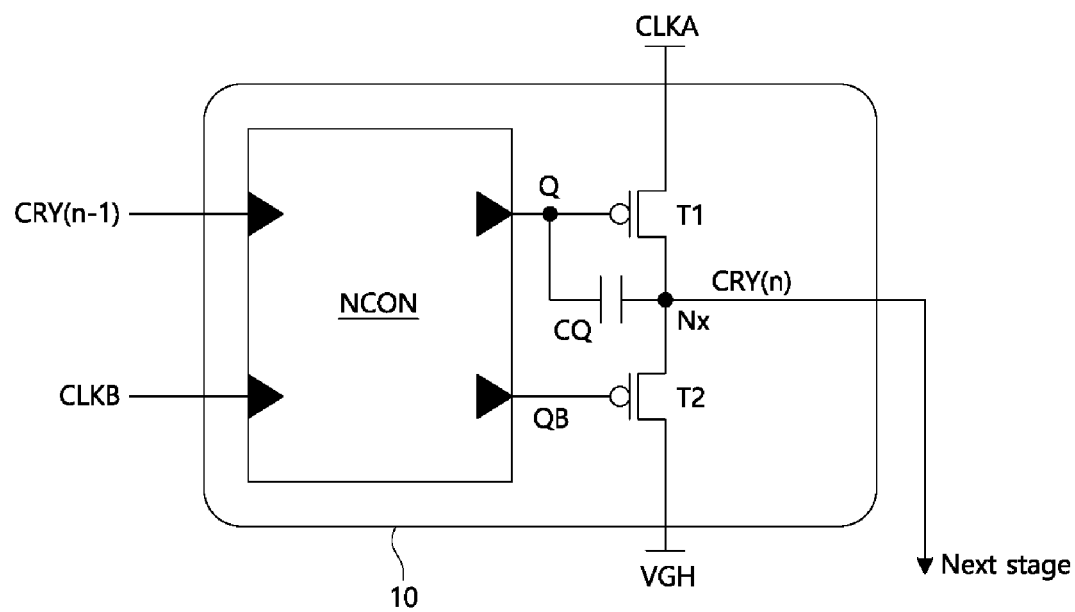
FIGS. 8 and 9 are diagrams illustrating a carry generating circuit included in a gate stage according to an embodiment of the present disclosure.
Figure 9:
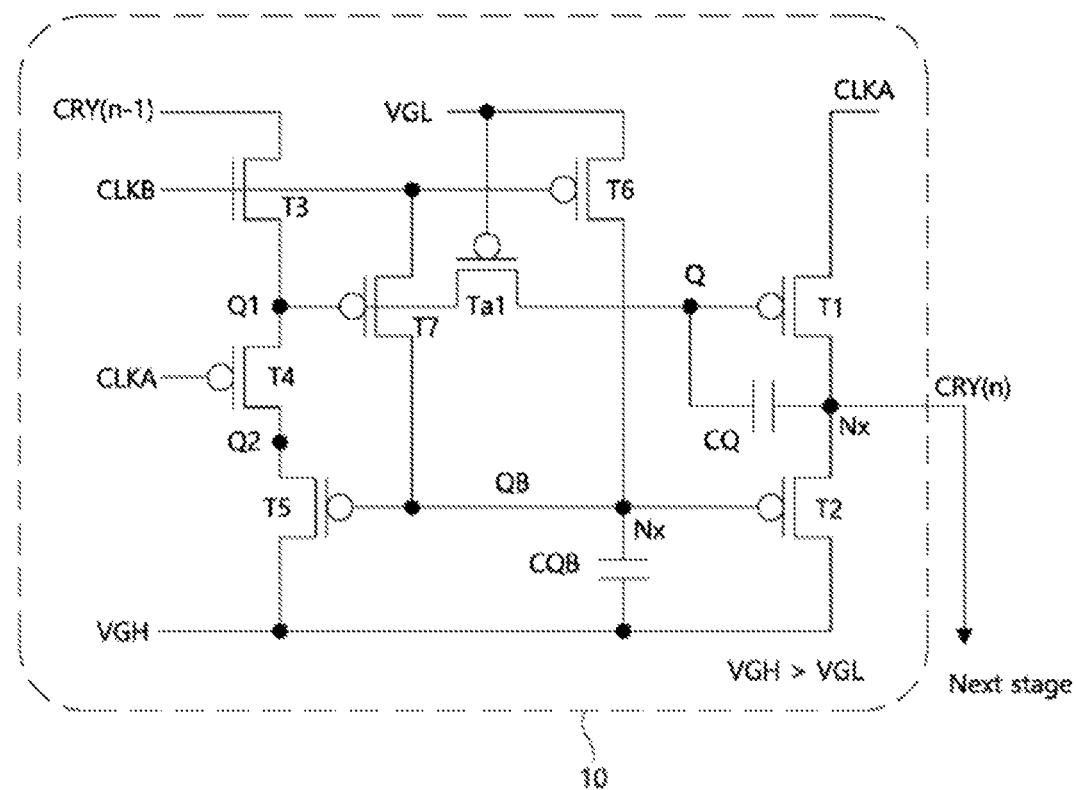
Figure 10:
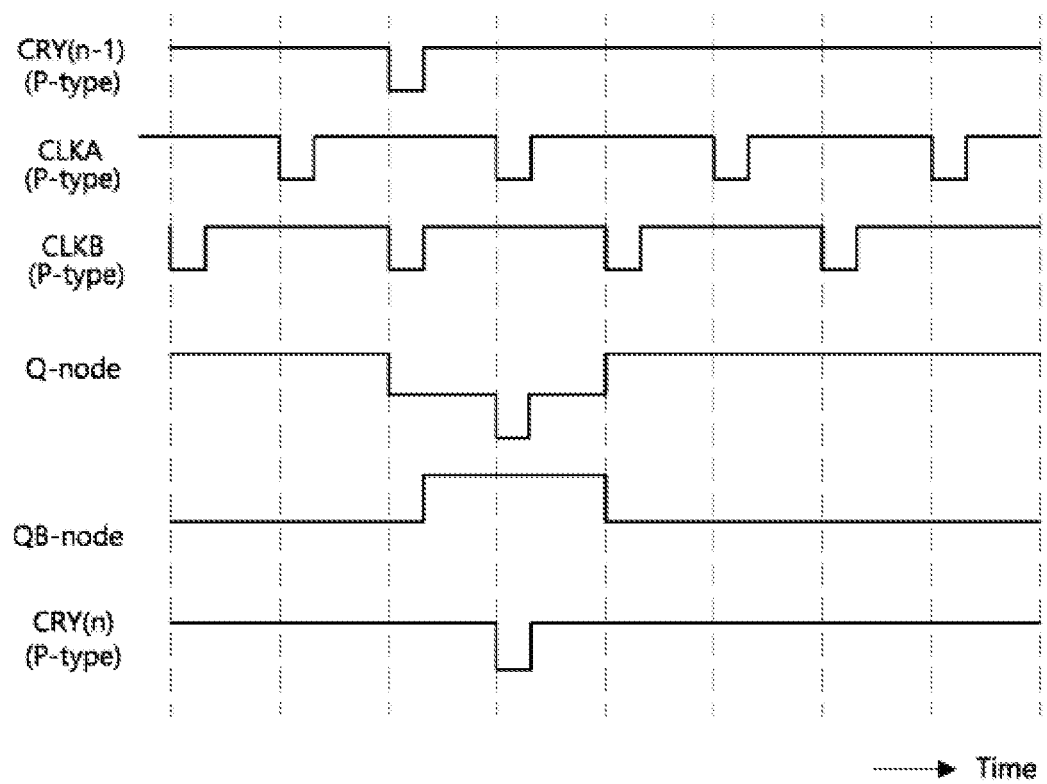
FIG. 10 is a diagram showing an operation waveform of the carry generating circuit of FIG. 9 according to an embodiment of the present disclosure.

FIGS. 8 and 9 are diagrams illustrating a carry generating circuit included in a gate stage. FIG. 10 is a diagram showing an operation waveform of the carry generating circuit of FIG. 9.

Referring to FIGS. 8 and 9, the carry generating circuit 10 according to the present embodiment may include a first carry transistor T1, a second carry transistor T2, a first carry capacitor CQ, and a node controller NCON, and moreover, may generate a second carry signal CRY(n) which is a P-type pulse and may output the second carry signal CRY(n) to a next gate stage through a carry output node Nx.

A gate electrode of the first carry transistor T1 may be connected to the first carry control node Q, a first electrode of the first carry transistor T1 may be connected to an input terminal of a first clock signal CLKA, and a second electrode of the first carry transistor T1 may be connected to the carry output node Nx.

A gate electrode of the second carry transistor T2 may be connected to the second carry control node QB, a first electrode of the second carry transistor T2 may be connected to the carry output node Nx, and a second electrode of the second carry transistor T2 may be connected to an input terminal for a gate high voltage VGH.

The first carry capacitor CQ may be connected to the first carry control node Q and the carry output node Nx.

The node controller NCON may control a voltage of the first carry control node Q and a voltage of the second carry control node QB on the basis of the first and second clock signals CLKA and CLKB and a first carry signal CRY(n−1) input a previous gate stage. The node controller NCON, as in FIG. 9, may include third to eighth carry transistors T3 to T7 and Ta1 and a second carry capacitor CQB.

A gate electrode of the third carry transistor T3 may be connected to an input terminal for the second clock signal CLKB, a first electrode thereof may be connected to an input terminal for the first carry signal CRY(n−1), and a second electrode thereof may be connected to a first secondary node Q1.

A gate electrode of the fourth carry transistor T4 may be connected to an input terminal for the first clock signal CLKA, a first electrode thereof may be connected to the first secondary node Q1, and a second electrode thereof may be connected to a second secondary node Q2.

A gate electrode of the fifth carry transistor T5 may be connected to the second carry control node QB, a first electrode thereof may be connected to the second secondary node Q2, and a second electrode thereof may be connected to the input terminal for the gate high voltage VGH.

A gate electrode of the sixth carry transistor T6 may be connected to the input terminal for the second clock signal CLKB, a first electrode thereof may be connected to an input terminal for a gate low voltage VGL which is lower than a gate high voltage VGH, and a second electrode thereof may be connected to the second secondary node QB.

A gate electrode of the seventh carry transistor T7 may be connected to the first secondary node Q1, a first electrode thereof may be connected to the input terminal for the second clock signal CLKB, and a second electrode thereof may be connected to the second carry control node QB.

A gate electrode of the eighth carry transistor Ta1 may be connected to the input terminal for the gate low voltage VGL, a first electrode thereof may be connected to the first secondary node Q1, and a second electrode thereof may be connected to the first carry control node Q.

The second carry capacitor CQB may be connected between the second carry control node QB and the input terminal for the gate low voltage VGL.

All transistors included in the carry generating circuit 10 may be implemented as P-type LTPS TFTs, and the first and second clock signals CLKA and CLKB and the first carry signal CRY(n−1) may each be a P-type pulse which swings between the gate high voltage VGH and the gate low voltage VGL.

Referring to FIG. 10, the first carry signal CRY(n−1) may be synchronized with a first pulse of the second clock signal CLKB, and the second carry signal CRY(n) may be synchronized with a first pulse of the first clock signal CLKA. The first pulse of the first clock signal CLKA may be a phase which is later than that of the first pulse of the second clock signal CLKB. Therefore, the second carry signal CRY(n) may have a phase which is later than that of the first carry signal CRY(n−1).

A voltage of the first carry control node Q may be decreased to the gate low voltage VGL by the first carry signal CRY(n−1) of the gate low voltage VGL which is input in synchronization with the first pulse of the second clock signal CLKB, and then, may be increased to the gate high voltage VGH by the first carry signal CRY(n−1) of the gate high voltage VGH which is input in synchronization with the second pulse succeeding the first pulse of the second clock signal CLKB. A voltage of the first carry control node Q may be bootstrapped to a voltage which is lower than the gate low voltage VGL in synchronization with the first pulse of the first clock signal CLKA, and then, may increase to the gate low voltage VGL.

A voltage of the second carry control node QB may maintain the gate high voltage VGH in only an interval between the first pulse and the second pulse of the second clock signal CLKB and may maintain the gate low voltage VGL in the other interval.

On the other hand, the first and second carry transistors T1 and T2 may be turned on/off based on voltages of the first and second carry control nodes Q and QB, and thus, the P-type second carry signal CRY(n) synchronized with the first pulse of the first clock signal CLKA may be output to the carry output node Nx.

Figure 11:
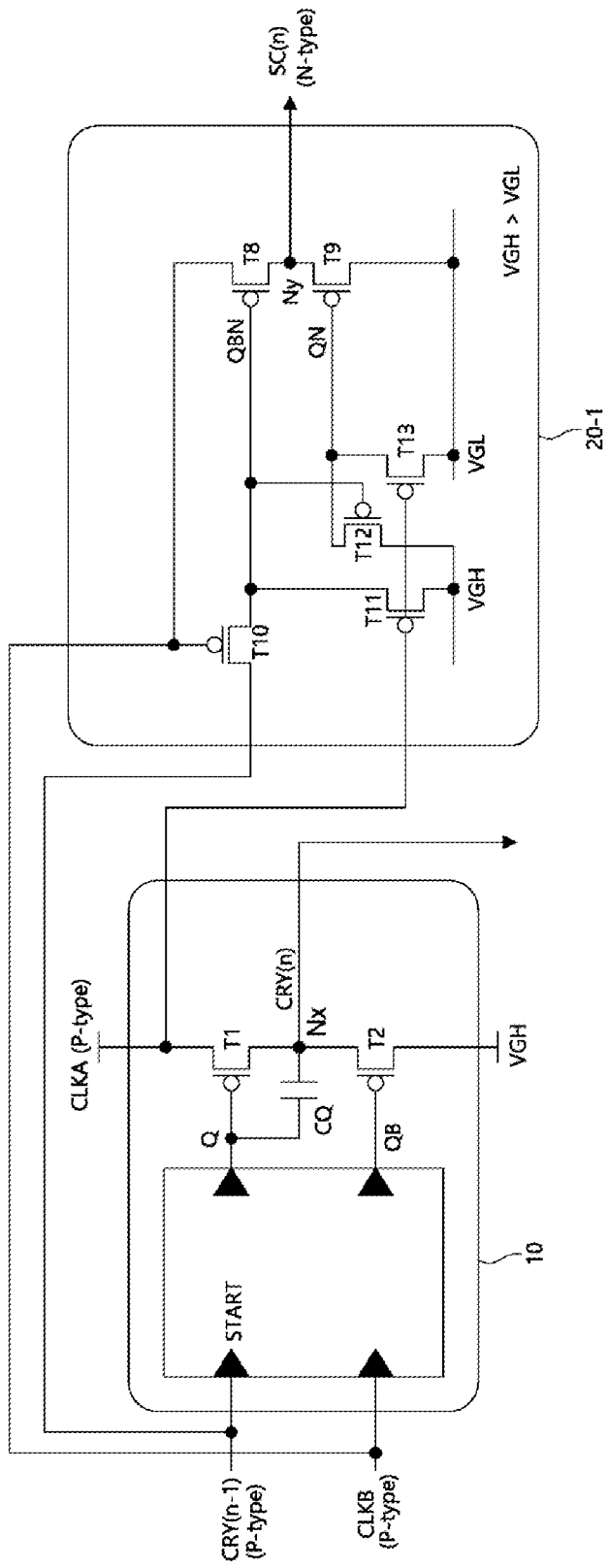
FIGS. 11 to 22 are diagrams showing first to twelfth embodiments of a scan generating circuit connected to a carry generating circuit in a gate stage.

FIG. 11 is a diagram showing a first embodiment of a scan generating circuit connected to a carry generating circuit in a gate stage.

Referring to FIG. 11, a scan generating circuit 20-1 according to the first embodiment may include a plurality of P-type transistors (for example, first to eighth transistors) T8 to T13, and moreover, may generate a scan signal SC(n) which is an N-type pulse and may output the scan signal SC(n) to a gate line through a scan output node Ny.

The first transistor T8 may be turned on/off with a voltage of a first scan control node QBN. A gate electrode of the first transistor T8 may be connected to the first scan control node QBN, a first electrode of the first transistor T8 may be connected to an input terminal for a second clock signal CLKB, and a second electrode of the first transistor T8 may be connected to the scan output node Ny.

The second transistor T9 may be turned on/off with a voltage of a second scan control node QN. A gate electrode of the second transistor T9 may be connected to the second scan control node QN, a first electrode of the second transistor T9 may be connected to the scan output node Ny, and a second electrode of the second transistor T9 may be connected to an input terminal for a gate low voltage VGL.

The third transistor T10 may be turned on/off based on the second clock signal CLKB. A gate electrode of the third transistor T10 may be connected to an input terminal for the second clock signal CLKB, a first electrode of the third transistor T10 may be connected to an input terminal for a first carry signal CRY(n−1), and a second electrode of the third transistor T10 may be connected to the first scan control node QBN.

The fourth transistor T11 may be turned on/off with a first clock signal CLKA. A gate electrode of the fourth transistor T11 may be connected to an input terminal for the first clock signal CLKA, a first electrode of the fourth transistor T11 may be connected to the first scan control node QBN, and a second electrode of the fourth transistor T11 may be connected to an input terminal for a gate high voltage VGH which is higher than the gate low voltage VGL.

The fifth transistor T12 may be turned on/off with a voltage of the first scan control node QBN. A gate electrode of the fifth transistor T12 may be connected to the first scan control node QBN, a first electrode of the fifth transistor T12 may be connected to the second scan control node QN, and a second electrode of the fifth transistor T12 may be connected to the input terminal for the gate high voltage VGH.

The sixth transistor T13 may be turned on/off with the first clock signal CLKA. A gate electrode of the sixth transistor T13 may be connected to the input terminal for the first clock signal CLKA, a first electrode of the sixth transistor T13 may be connected to the second scan control node QN, and a second electrode of the sixth transistor T13 may be connected to the input terminal for the gate low voltage VGL.

Figure 23:
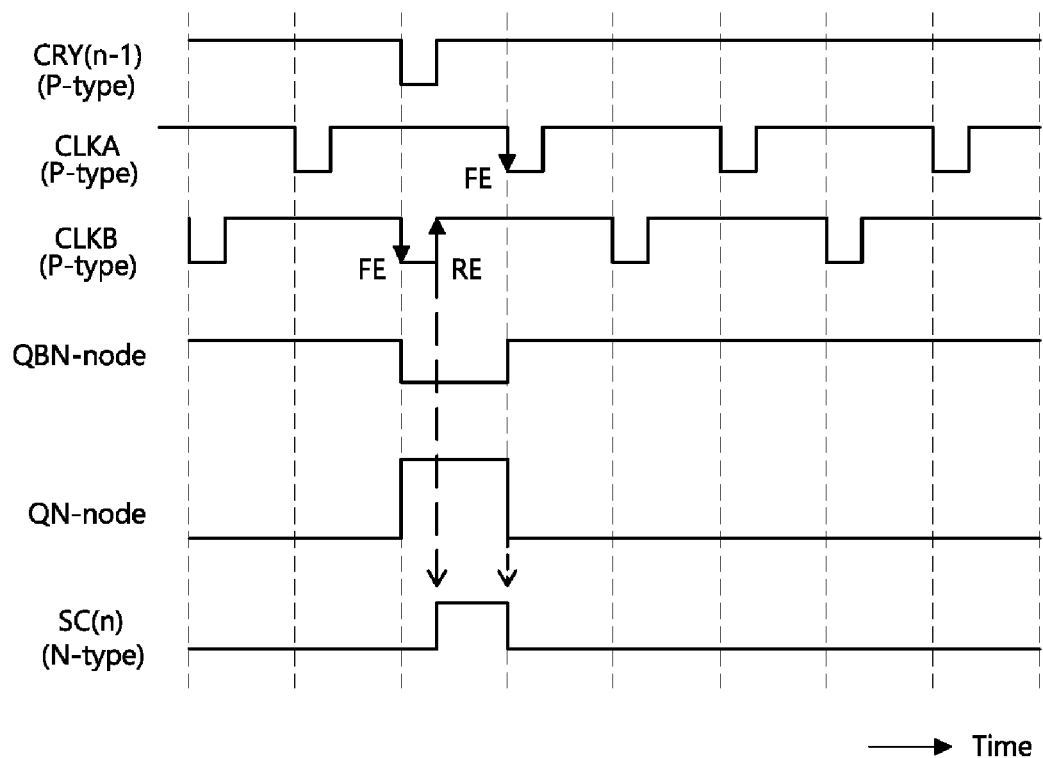
FIG. 23 is a diagram showing an operation waveform of a scan generating circuit of FIGS. 11 to 22 according to an embodiment of the present disclosure.

Referring to a driving waveform of FIG. 23, a voltage of the first scan control node QBN may be decreased to the gate low voltage VGL by the first carry signal CRY(n−1) of the gate low voltage VGL which is input in synchronization with a first pulse of the second clock signal CLKB, and then, may be increased to the gate high voltage VGH in synchronization with a second pulse of the first clock signal CLKA succeeding the first pulse. In other words, a voltage of the first scan control node QBN may be decreased to the gate low voltage VGL in synchronization with a falling edge FE of the first pulse, and then, may be increased to the gate high voltage VGH in synchronization with a falling edge FE of the second pulse.

A voltage of the second scan control node QN may be shifted to be opposite to that of the first scan control node QBN. A voltage of the second scan control node QN may be increased to the gate high voltage VGH in synchronization with the falling edge FE of the first pulse, and then, may be decreased to the gate low voltage VGL in synchronization with the falling edge FE of the second pulse.

On the other hand, the first and second transistors T8 and T9 may be turned on/off based on voltages of the first and second scan control nodes QBN and QN, and thus, may have the gate high voltage VGH in only an interval between the rising edge RE of the first pulse and the falling edge FE of the second pulse adjacent to each other and an N-type pulse (i.e., the scan signal SC(n)) having the gate low voltage VGL may be output to the scan output node Ny in the other intervals.

Figure 12:
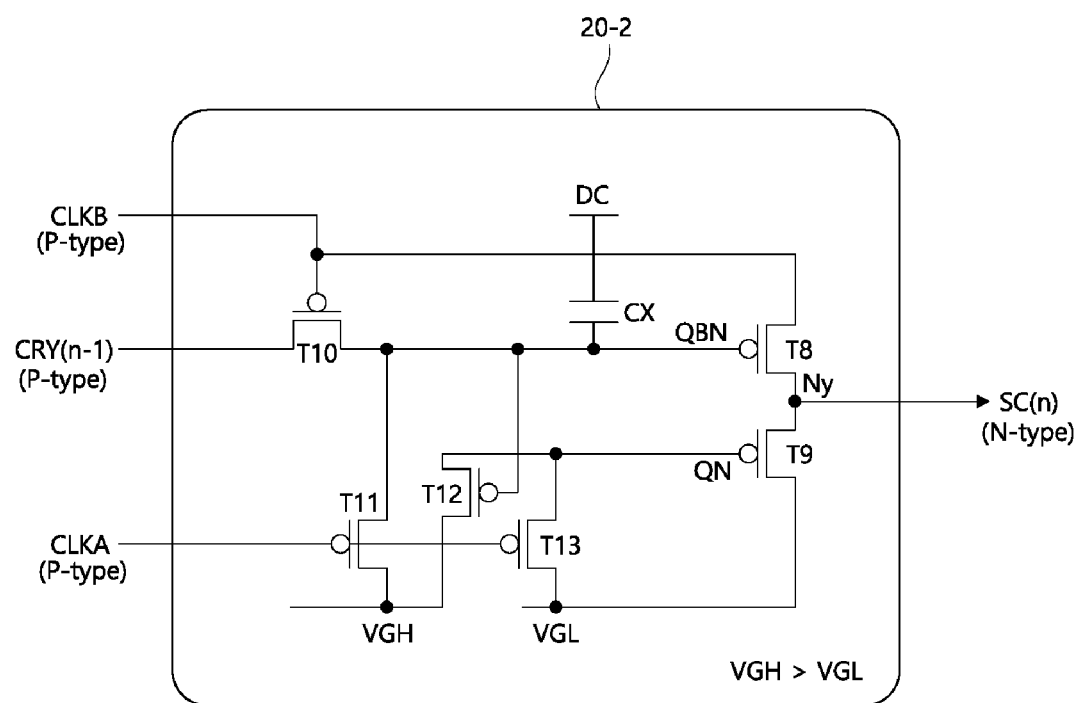

FIG. 12 is a diagram showing a second embodiment of a scan generating circuit connected to a carry generating circuit in a gate stage.

Referring to FIG. 12, a scan generating circuit 20-2 according to the second embodiment may include a plurality of P-type LTPS transistors T8 to T13, and moreover, may generate a scan signal SC(n) which is an N-type pulse and may output the scan signal SC(n) to a gate line through a scan output node Ny.

Comparing with the scan generating circuit 20-1 of FIG. 11, the scan generating circuit 20-2 according to the second embodiment may have a difference in that the scan generating circuit 20-2 further includes a stabilization capacitor CX connected to a first scan control node QBN. Except for the stabilization capacitor CX, the other elements of the scan generating circuit 20-2 according to the second embodiment may be substantially the same as those of the scan generating circuit 20-1 of FIG. 11.

A first electrode of the stabilization capacitor CX may be connected to the first scan control node QBN, and a second electrode of the stabilization capacitor CX may be connected to a direct current (DC) voltage terminal DC. Referring to a driving waveform of FIG. 23, a voltage of the first scan control node QBN may be decreased to a gate low voltage VGL by a first carry signal CRY(n−1) of the gate low voltage VGL which is input in synchronization with a first pulse (i.e., a gate low voltage having an on level) of a second clock signal CLKB. The stabilization capacitor CX may stably maintain the gate low voltage VGL of the first scan control node QBN for a predetermined time after the second clock signal CLKB is inverted from an on level (i.e., a gate low voltage) to an off level (i.e., a gate high voltage).

The DC voltage terminal DC may be connected to an input terminal for the gate high voltage VGH or an input terminal for the gate low voltage VGL, and in this case, the number of power sources needed for the scan generating circuit 20-2 may be minimized. The DC voltage terminal DC may be connected to a DC power source which differs from the gate high voltage VGH and the gate low voltage VGL.

Figure 13:
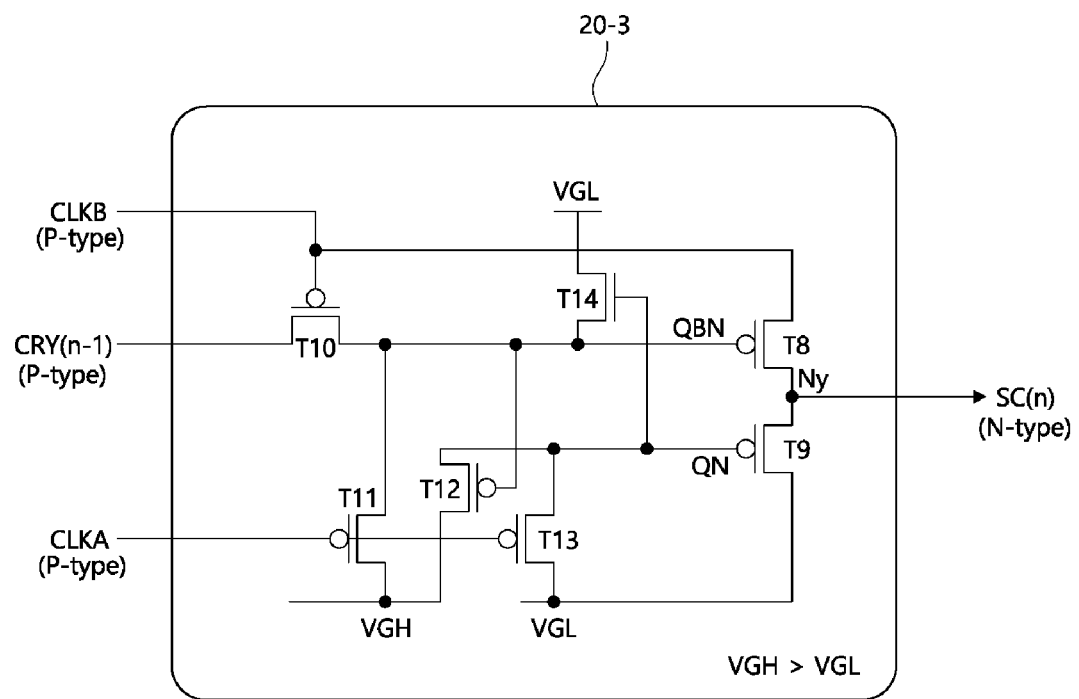

FIG. 13 is a diagram showing a third embodiment of a scan generating circuit connected to a carry generating circuit in a gate stage.

Referring to FIG. 13, a scan generating circuit 20-3 according to the third embodiment may include a plurality of P-type LTPS transistors T8 to T13, and moreover, may generate a scan signal SC(n) which is an N-type pulse and may output the scan signal SC(n) to a gate line through a scan output node Ny.

Comparing with the scan generating circuit 20-1 of FIG. 11, the scan generating circuit 20-3 according to the third embodiment may have a difference in that the scan generating circuit 20-3 further includes a seventh transistor T14 connected to a first scan control node QBN. Except for the seventh transistor T14, the other elements of the scan generating circuit 20-3 according to the third embodiment may be substantially the same as those of the scan generating circuit 20-1 of FIG. 11.

A gate electrode of the seventh transistor T14 may be connected to a second scan control node QN, a first electrode of the seventh transistor T14 may be connected to the first scan control node QBN, and a second electrode of the seventh transistor T14 may be connected to an input terminal for a gate low voltage VGL. The seventh transistor T14 may be implemented as an N-type oxide transistor for stabilizing a voltage of the first scan control node QBN.

Referring to a driving waveform of FIG. 23, a voltage of the first scan control node QBN may be decreased to the gate low voltage VGL by a first carry signal CRY(n−1) of the gate low voltage VGL which is input in synchronization with a first pulse (i.e., a gate low voltage having an on level) of a second clock signal CLKB. At this time, as a fifth transistor T12 is turned on, a voltage of a second scan control node QN may increase to a gate high voltage VGH. The seventh transistor T14 may maintain a turn-on state on the basis of the gate high voltage VGH of the second scan control node QN after the second clock signal CLKB is inverted from an on level (i.e., a gate low voltage) to an off level (i.e., a gate high voltage), and thus, may stably maintain the gate low voltage VGL of the first scan control node QBN for a predetermined time.

Figure 14:
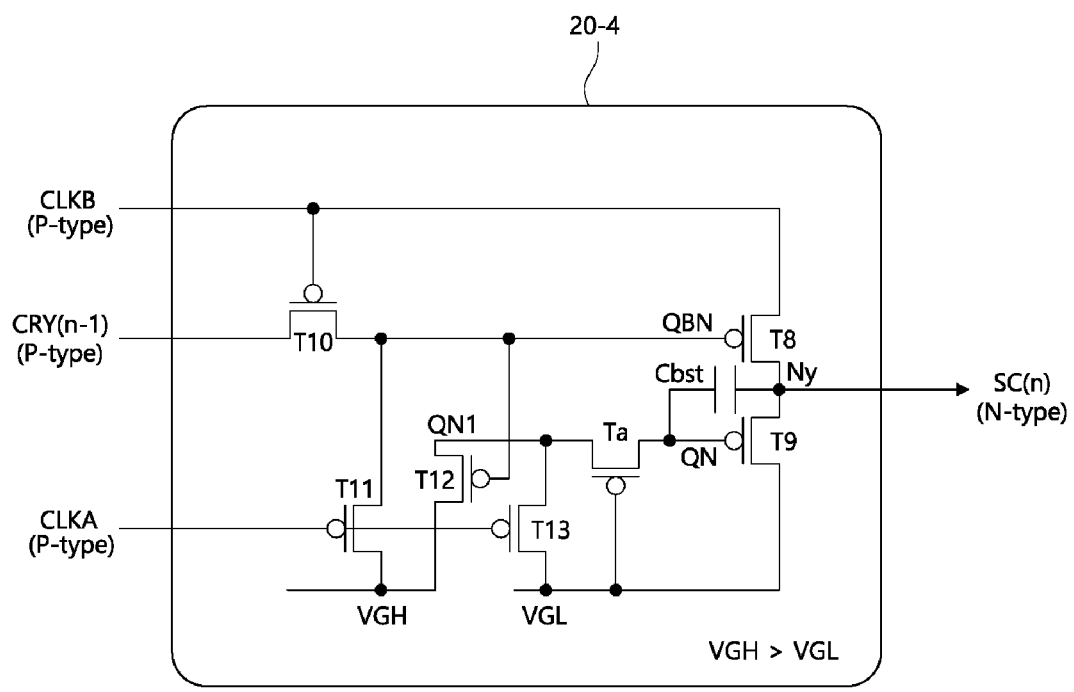

FIG. 14 is a diagram showing a fourth embodiment of a scan generating circuit connected to a carry generating circuit in a gate stage.

Referring to FIG. 14, a scan generating circuit 20-4 according to the fourth embodiment may include a plurality of P-type LTPS transistors T8 to T13, and moreover, may generate a scan signal SC(n) which is an N-type pulse and may output the scan signal SC(n) to a gate line through a scan output node Ny.

Comparing with the scan generating circuit 20-1 of FIG. 11, the scan generating circuit 20-4 according to the fourth embodiment may have a difference in that the scan generating circuit 20-4 further includes a bootstrapping capacitor Cbst and a seventh transistor Ta connected to a second scan control node QN. Except for the bootstrapping capacitor Cbst and the seventh transistor Ta, the other elements of the scan generating circuit 20-4 according to the fourth embodiment may be substantially the same as those of the scan generating circuit 20-1 of FIG. 11.

A first electrode of the bootstrapping capacitor Cbst may be connected to a scan output node Ny, and a second electrode of the bootstrapping capacitor Cbst may be connected to a second scan control node QN. A gate electrode of the seventh transistor Ta may be connected to an input terminal for a gate low voltage VGL, a first electrode of the seventh transistor Ta may be connected to the second scan control node QN, and a second electrode of the seventh transistor Ta may be connected to a secondary node QN1. Second electrodes of fifth and sixth transistors T12 and T13 may be further connected to the secondary node QN1.

Referring to a driving waveform of FIG. 23, a voltage of the first scan control node QBN and a voltage of the second scan control node QN may be changed to be opposite to each other. The first and second transistors T8 and T9 may be turned on/off on the basis of voltages of the first and second scan control nodes QBN and QN, and thus, may have a gate high voltage VGH in only an interval between a rising edge RE of a second clock signal CLKB and a falling edge FE of a first clock signal CLKA and an N-type scan signal SC(n) having the gate low voltage VGL may be output to the scan output node Ny in the other intervals.

The bootstrapping capacitor Cbst and the seventh transistor Ta may bootstrap a voltage of the second scan control node QN to a lower voltage than the gate low voltage VGL while the second transistor T9 is being turned on. When a voltage of the second scan control node QN is lower than the gate low voltage VGL, an electrical connection between the second scan control node QN and a secondary node QN1 may be disconnected by the turned-off seventh transistor Ta, and thus, a bootstrapping operation may be stably implemented.

Based on such a bootstrapping operation, a falling time (i.e., a time for which a gate high voltage is shifted to a gate low voltage) of the N-type scan signal SC(n) may be minimized. In other words, the waveform distortion of the N-type scan signal SC(n) may be prevented.

Figure 15:
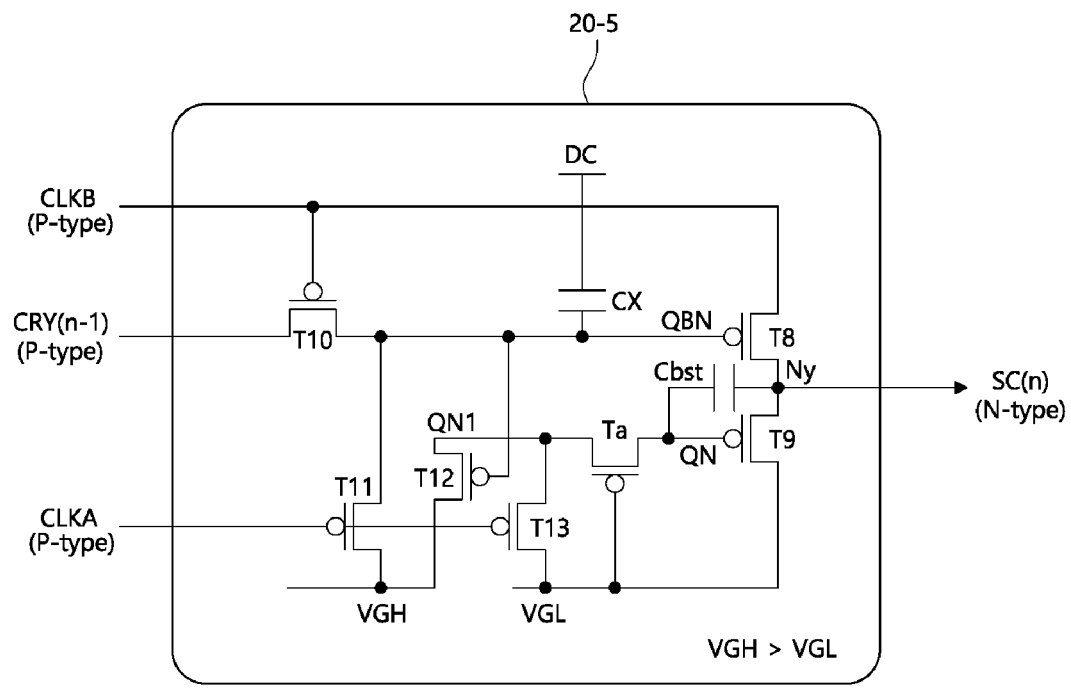

FIG. 15 is a diagram showing a fifth embodiment of a scan generating circuit connected to a carry generating circuit in a gate stage.

Referring to FIG. 15, a scan generating circuit 20-5 according to the fifth embodiment may include a plurality of P-type LTPS transistors T8 to T13 and Ta, and moreover, may generate a scan signal SC(n) which is an N-type pulse and may output the scan signal SC(n) to a gate line through a scan output node Ny.

Comparing with the scan generating circuit 20-4 of FIG. 14, the scan generating circuit 20-5 according to the fifth embodiment may have a difference in that the scan generating circuit 20-5 further includes a stabilization capacitor CX connected to a first scan control node QBN. Except for the stabilization capacitor CX, the other elements of the scan generating circuit 20-5 according to the fifth embodiment may be substantially the same as those of the scan generating circuit 20-4 of FIG. 14.

A first electrode of the stabilization capacitor CX may be connected to the first scan control node QBN, and a second electrode of the stabilization capacitor CX may be connected to a DC voltage terminal DC. Referring to a driving waveform of FIG. 23, a voltage of the first scan control node QBN may be decreased to a gate low voltage VGL by a first carry signal CRY(n−1) of the gate low voltage VGL which is input in synchronization with a first pulse (i.e., a gate low voltage having an on level) of a second clock signal CLKB. The stabilization capacitor CX may stably maintain the gate low voltage VGL of the first scan control node QBN for a predetermined time after the second clock signal CLKB is inverted from an on level (i.e., a gate low voltage) to an off level (i.e., a gate high voltage).

The DC voltage terminal DC may be connected to an input terminal for the gate high voltage VGH or an input terminal for the gate low voltage VGL, and in this case, the number of power sources needed for the scan generating circuit 20-5 may be minimized. The DC voltage terminal DC may be connected to a DC power source which differs from the gate high voltage VGH and the gate low voltage VGL.

Figure 16:
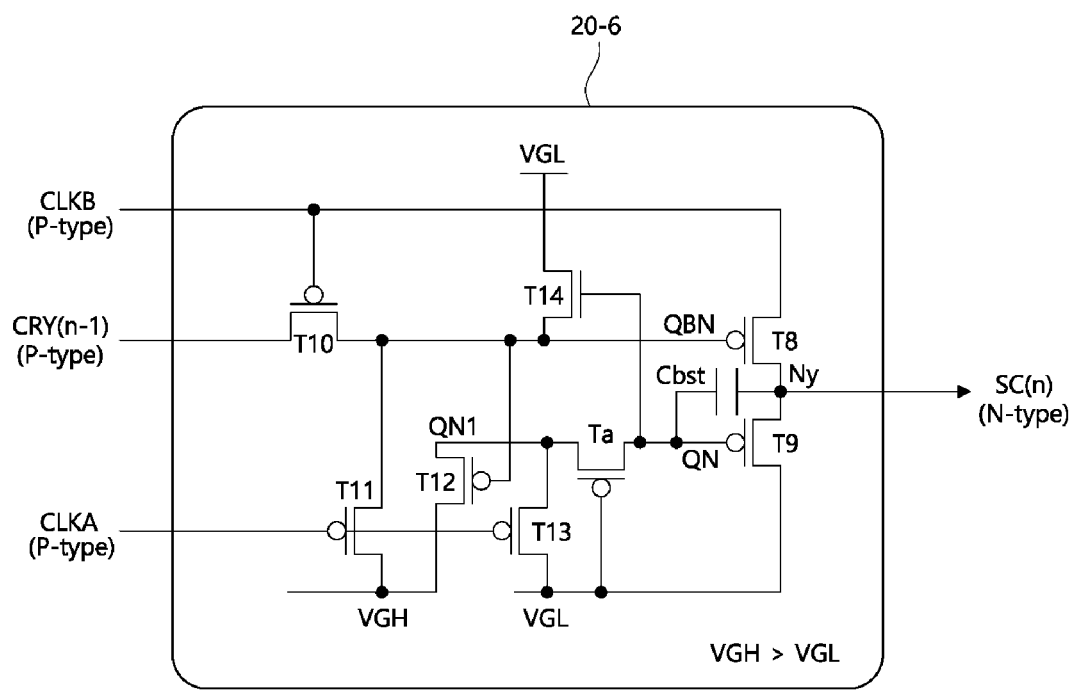

FIG. 16 is a diagram showing a sixth embodiment of a scan generating circuit connected to a carry generating circuit in a gate stage.

Referring to FIG. 16, a scan generating circuit 20-6 according to the sixth embodiment may include a plurality of P-type LTPS transistors T8 to T13 and Ta, and moreover, may generate a scan signal SC(n) which is an N-type pulse and may output the scan signal SC(n) to a gate line through a scan output node Ny.

Comparing with the scan generating circuit 20-4 of FIG. 14, the scan generating circuit 20-6 according to the sixth embodiment may have a difference in that the scan generating circuit 20-6 further includes an eighth transistor T14 connected to a first scan control node QBN. Except for the eighth transistor T14, the other elements of the scan generating circuit 20-6 according to the sixth embodiment may be substantially the same as those of the scan generating circuit 20-4 of FIG. 14.

A gate electrode of the eighth transistor T14 may be connected to a second scan control node QN, a first electrode of the eighth transistor T14 may be connected to the first scan control node QBN, and a second electrode of the eighth transistor T14 may be connected to an input terminal for a gate low voltage VGL. The eighth transistor T14 may be implemented as an N-type oxide transistor for stabilizing a voltage of the first scan control node QBN.

Referring to a driving waveform of FIG. 23, a voltage of the first scan control node QBN may be decreased to the gate low voltage VGL by a first carry signal CRY(n−1) of the gate low voltage VGL which is input in synchronization with a first pulse (i.e., a gate low voltage having an on level) of a second clock signal CLKB. At this time, as a fifth transistor T12 and a seventh transistor Ta are turned on, a voltage of a second scan control node QN may increase to a gate high voltage VGH. The eighth transistor T14 may maintain a turn-on state on the basis of the gate high voltage VGH of the second scan control node QN after the second clock signal CLKB is inverted from an on level (i.e., a gate low voltage) to an off level (i.e., a gate high voltage), and thus, may stably maintain the gate low voltage VGL of the first scan control node QBN for a predetermined time.

Figure 17:
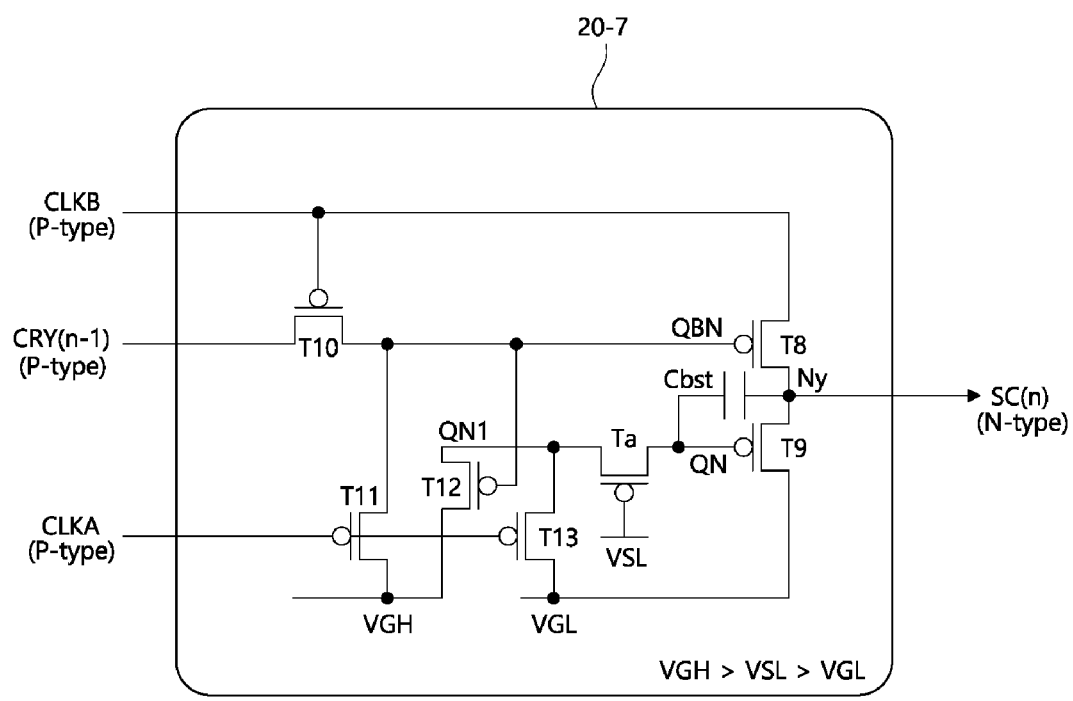

FIG. 17 is a diagram showing a seventh embodiment of a scan generating circuit connected to a carry generating circuit in a gate stage.

Referring to FIG. 17, a scan generating circuit 20-7 according to the seventh embodiment may include a plurality of P-type LTPS transistors T8 to T13, and moreover, may generate a scan signal SC(n) which is an N-type pulse and may output the scan signal SC(n) to a gate line through a scan output node Ny.

Comparing with the scan generating circuit 20-1 of FIG. 11, the scan generating circuit 20-7 according to the seventh embodiment may have a difference in that the scan generating circuit 20-7 further includes a bootstrapping capacitor Cbst and a seventh transistor Ta connected to a second scan control node QN. Except for the bootstrapping capacitor Cbst and the seventh transistor Ta, the other elements of the scan generating circuit 20-7 according to the seventh embodiment may be substantially the same as those of the scan generating circuit 20-1 of FIG. 11.

A first electrode of the bootstrapping capacitor Cbst may be connected to a scan output node Ny, and a second electrode of the bootstrapping capacitor Cbst may be connected to a second scan control node QN. A gate electrode of the seventh transistor Ta may be connected to an input terminal for a gate middle voltage VSL, a first electrode of the seventh transistor Ta may be connected to the second scan control node QN, and a second electrode of the seventh transistor Ta may be connected to a secondary node QN1. Second electrodes of fifth and sixth transistors T12 and T13 may be further connected to the secondary node QN1. The gate middle voltage VSL may be higher than the gate low voltage VGL and lower than the gate high voltage VGH. The gate middle voltage VSL may be a voltage between the gate low voltage VGL and the gate high voltage VGH.

Referring to a driving waveform of FIG. 23, a voltage of the first scan control node QBN and a voltage of the second scan control node QN may be changed to be opposite to each other. The first and second transistors T8 and T9 may be turned on/off on the basis of voltages of the first and second scan control nodes QBN and QN, and thus, may have a gate high voltage VGH in only an interval between a rising edge RE of a second clock signal CLKB and a falling edge FE of a first clock signal CLKA and an N-type scan signal SC(n) having the gate low voltage VGL may be output to the scan output node Ny in the other intervals.

The bootstrapping capacitor Cbst and the seventh transistor Ta may bootstrap a voltage of the second scan control node QN to a lower voltage than the gate low voltage VGL while the second transistor T9 is being turned on. When a voltage of the second scan control node QN is lower than the gate low voltage VGL, an electrical connection between the second scan control node QN and a secondary node QN1 may be disconnected by the turned-off seventh transistor Ta, and thus, a bootstrapping operation may be stably implemented. Furthermore, when the gate middle voltage VSL which is higher than the gate low voltage VSL is applied to a gate electrode of the seventh transistor Ta, a bootstrapping operation may be stably maintained by reinforced reverse biasing applied by the seventh transistor Ta for a long time.

Based on such a bootstrapping operation, a falling time (i.e., a time for which a gate high voltage is shifted to a gate low voltage) of the N-type scan signal SC(n) may be minimized. In other words, the waveform distortion of the N-type scan signal SC(n) may be prevented.

Figure 18:
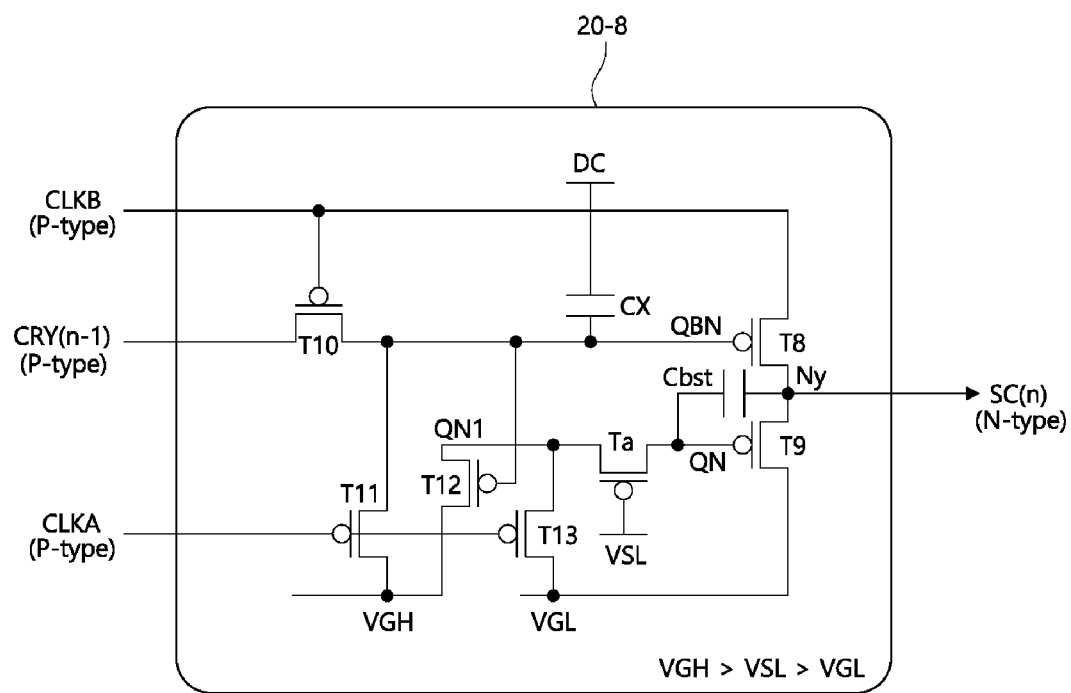

FIG. 18 is a diagram showing an eighth embodiment of a scan generating circuit connected to a carry generating circuit in a gate stage.

Referring to FIG. 18, a scan generating circuit 20-8 according to the eighth embodiment may include a plurality of P-type LTPS transistors T8 to T13 and Ta, and moreover, may generate a scan signal SC(n) which is an N-type pulse and may output the scan signal SC(n) to a gate line through a scan output node Ny.

Comparing with the scan generating circuit 20-7 of FIG. 17, the scan generating circuit 20-8 according to the eighth embodiment may have a difference in that the scan generating circuit 20-8 further includes a stabilization capacitor CX connected to a first scan control node QBN. Except for the stabilization capacitor CX, the other elements of the scan generating circuit 20-8 according to the eighth embodiment may be substantially the same as those of the scan generating circuit 20-7 of FIG. 17.

A first electrode of the stabilization capacitor CX may be connected to the first scan control node QBN, and a second electrode of the stabilization capacitor CX may be connected to a DC voltage terminal DC. Referring to a driving waveform of FIG. 23, a voltage of the first scan control node QBN may be decreased to a gate low voltage VGL by a first carry signal CRY(n−1) of the gate low voltage VGL which is input in synchronization with a first pulse (i.e., a gate low voltage having an on level) of a second clock signal CLKB. The stabilization capacitor CX may stably maintain the gate low voltage VGL of the first scan control node QBN for a predetermined time after the second clock signal CLKB is inverted from an on level (i.e., a gate low voltage) to an off level (i.e., a gate high voltage).

The DC voltage terminal DC may be connected to an input terminal for the gate high voltage VGH or an input terminal for the gate low voltage VGL, and in this case, the number of power sources needed for the scan generating circuit 20-5 may be minimized. The DC voltage terminal DC may be connected to a DC power source which differs from the gate high voltage VGH and the gate low voltage VGL.

Figure 19:
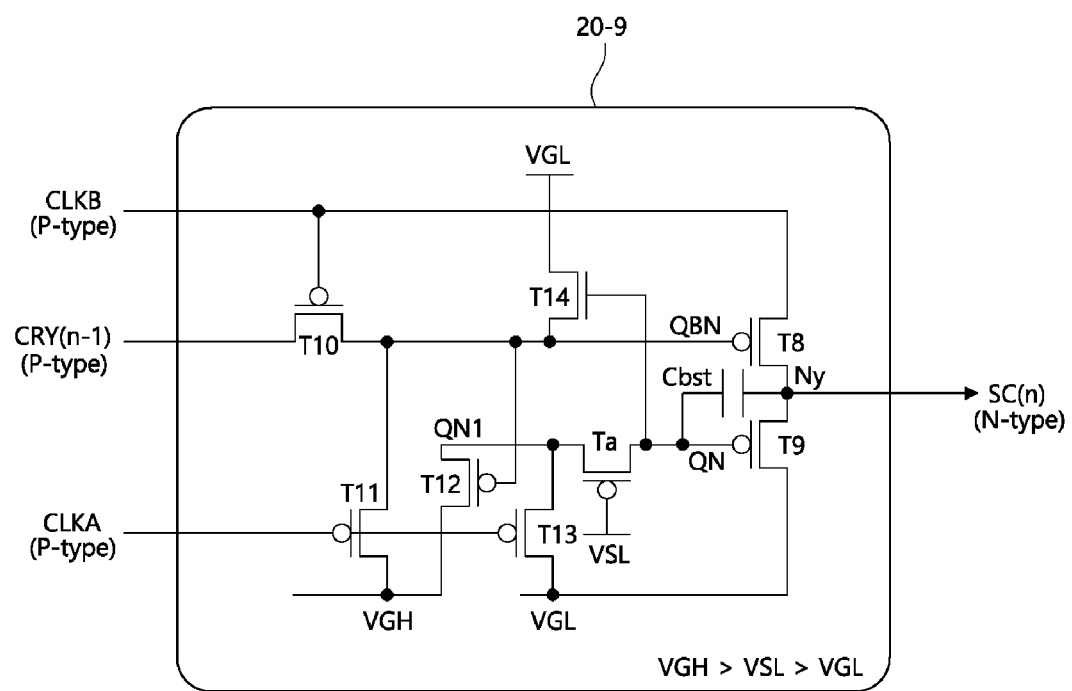

FIG. 19 is a diagram showing a ninth embodiment of a scan generating circuit connected to a carry generating circuit in a gate stage.

Referring to FIG. 19, a scan generating circuit 20-9 according to the ninth embodiment may include a plurality of P-type LTPS transistors T8 to T13 and Ta, and moreover, may generate a scan signal SC(n) which is an N-type pulse and may output the scan signal SC(n) to a gate line through a scan output node Ny.

Comparing with the scan generating circuit 20-7 of FIG. 17, the scan generating circuit 20-9 according to the ninth embodiment may have a difference in that the scan generating circuit 20-9 further includes an eighth transistor T14 connected to a first scan control node QBN. Except for the eighth transistor T14, the other elements of the scan generating circuit 20-7 according to the ninth embodiment may be substantially the same as those of the scan generating circuit 20-7 of FIG. 17.

A gate electrode of the eighth transistor T14 may be connected to a second scan control node QN, a first electrode of the seventh transistor T14 may be connected to the first scan control node QBN, and a second electrode of the eighth transistor T14 may be connected to an input terminal for a gate low voltage VGL. The eighth transistor T14 may be implemented as an N-type oxide transistor for stabilizing a voltage of the first scan control node QBN.

Referring to a driving waveform of FIG. 23, a voltage of the first scan control node QBN may be decreased to the gate low voltage VGL by a first carry signal CRY(n−1) of the gate low voltage VGL which is input in synchronization with a first pulse (i.e., a gate low voltage having an on level) of a second clock signal CLKB. At this time, as a fifth transistor T12 and a seventh transistor Ta are turned on, a voltage of a second scan control node QN may increase to a gate high voltage VGH. The eighth transistor T14 may maintain a turn-on state on the basis of the gate high voltage VGH of the second scan control node QN after the second clock signal CLKB is inverted from an on level (i.e., a gate low voltage) to an off level (i.e., a gate high voltage), and thus, may stably maintain the gate low voltage VGL of the first scan control node QBN for a predetermined time.

Figure 20:
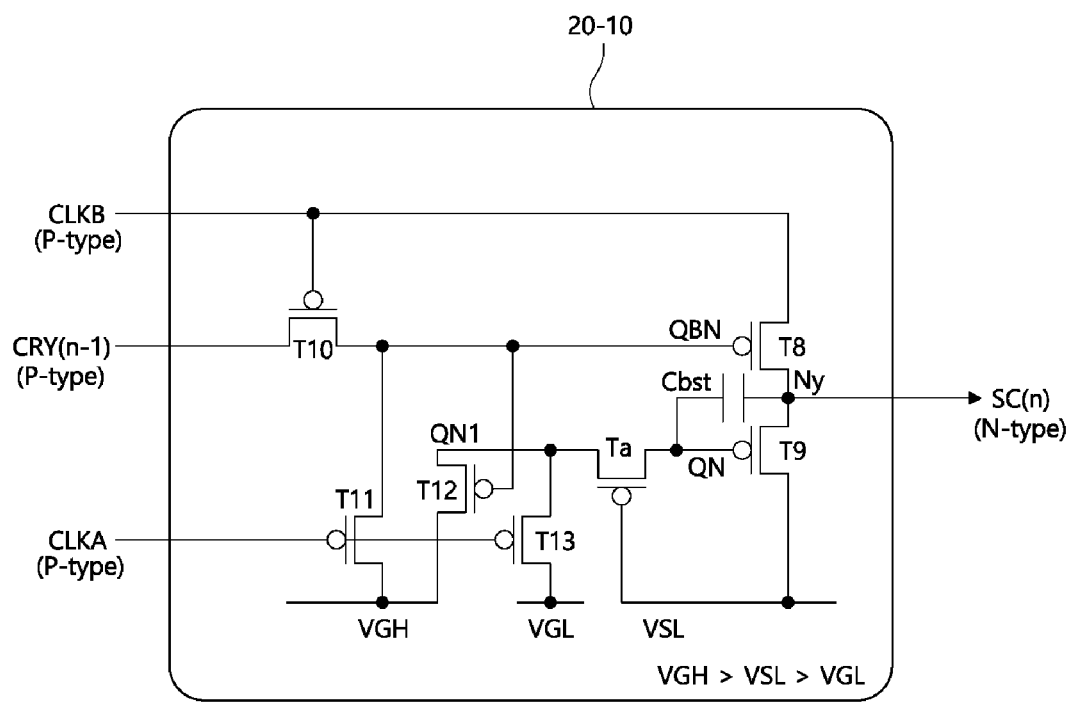

FIG. 20 is a diagram showing a tenth embodiment of a scan generating circuit connected to a carry generating circuit in a gate stage.

Referring to FIG. 20, a scan generating circuit 20-10 according to the tenth embodiment may include a plurality of P-type LTPS transistors T8 to T13 and Ta and a bootstrapping capacitor Cbst, and moreover, may generate a scan signal SC(n) which is an N-type pulse and may output the scan signal SC(n) to a gate line through a scan output node Ny.

Comparing with the scan generating circuit 20-7 of FIG. 17, the scan generating circuit 20-10 according to the tenth embodiment may be substantially the same as the scan generating circuit 20-7 of FIG. 17, except for a connection configuration of a second transistor T9.

The second transistor T9 may be turned on/off with a voltage of a second scan control node QN. A gate electrode of the second transistor T9 may be connected to the second scan control node QN, a first electrode of the second transistor T9 may be connected to the scan output node Ny, and a second electrode of the second transistor T9 may be connected to an input terminal for a gate middle voltage VSL. The gate middle voltage VSL may be higher than a gate low voltage VGL and lower than a gate high voltage VGH. The gate middle voltage VSL may be a voltage between the gate low voltage VGL and the gate high voltage VGH.

Because the second electrode of the second transistor T9 is connected to the input terminal for the gate middle voltage VSL, an N-type scan signal SC(n) may swing between the gate high voltage VGH and the gate middle voltage VSL. The gate middle voltage VSL of the N-type scan signal SC(n) may be a voltage for turning off an N-type second switching transistor ST2 included in a pixel. The gate low voltage VGL may be a voltage which is excessively low to turn off the second switching transistor ST2. When a second electrode of the second transistor T9 is connected to the input terminal for the gate middle voltage VSL, a swing width of the N-type scan signal SC(n), power consumption, and a falling time of the N-type scan signal SC(n) may be reduced.

Figure 21:
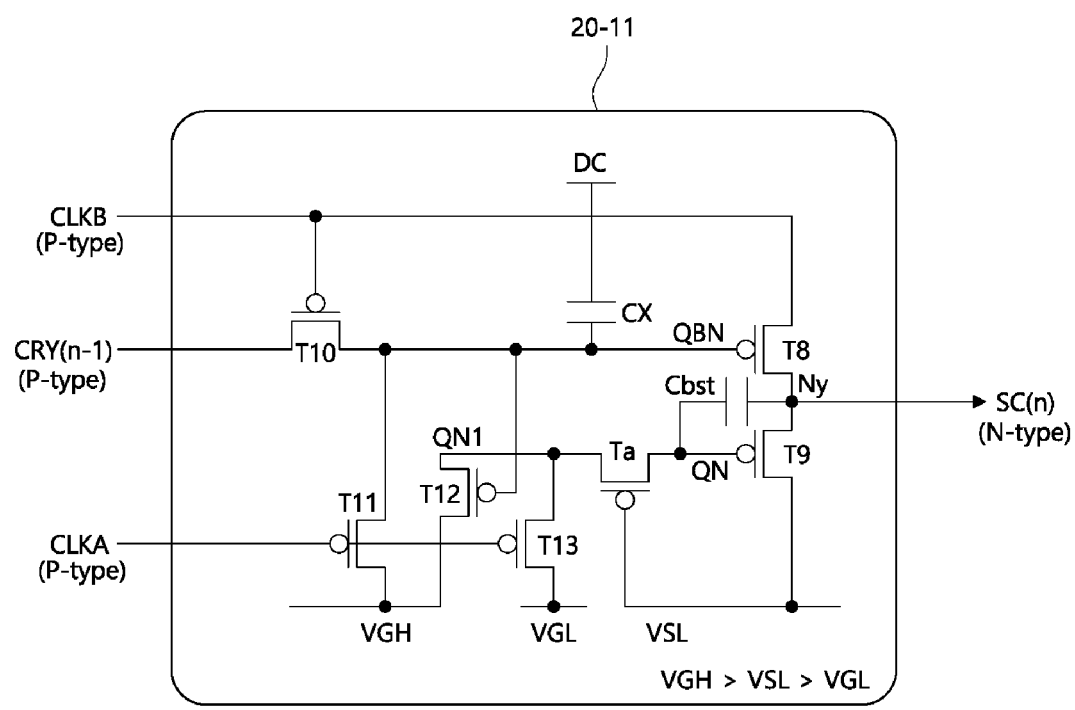

FIG. 21 is a diagram showing an eleventh embodiment of a scan generating circuit connected to a carry generating circuit in a gate stage.

Referring to FIG. 21, a scan generating circuit 20-11 according to the eleventh embodiment may include a plurality of P-type LTPS transistors T8 to T13 and Ta and a bootstrapping capacitor Cbst, and moreover, may generate a scan signal SC(n) which is an N-type pulse and may output the scan signal SC(n) to a gate line through a scan output node Ny.

Comparing with the scan generating circuit 20-10 of FIG. 20, the scan generating circuit 20-11 according to the eleventh embodiment may have a difference in that the scan generating circuit 20-11 further includes a stabilization capacitor CX connected to a first scan control node QBN. Except for the stabilization capacitor CX, the other elements of the scan generating circuit 20-11 according to the eleventh embodiment may be substantially the same as those of the scan generating circuit 20-10 of FIG. 20.

A first electrode of the stabilization capacitor CX may be connected to the first scan control node QBN, and a second electrode of the stabilization capacitor CX may be connected to a DC voltage terminal DC. Referring to a driving waveform of FIG. 23, a voltage of the first scan control node QBN may be decreased to a gate low voltage VGL by a first carry signal CRY(n−1) of the gate low voltage VGL which is input in synchronization with a first pulse (i.e., a gate low voltage having an on level) of a second clock signal CLKB. The stabilization capacitor CX may stably maintain the gate low voltage VGL of the first scan control node QBN for a predetermined time after the second clock signal CLKB is inverted from an on level (i.e., a gate low voltage) to an off level (i.e., a gate high voltage).

The DC voltage terminal DC may be connected to an input terminal for the gate high voltage VGH, an input terminal for the gate low voltage VGL, or an input terminal for the gate middle voltage VSL, and in this case, the number of power sources needed for the scan generating circuit 20-5 may be minimized. The DC voltage terminal DC may be connected to a DC power source which differs from the gate high voltage VGH, the gate low voltage VGL, and the gate middle voltage VSL.

Figure 22:
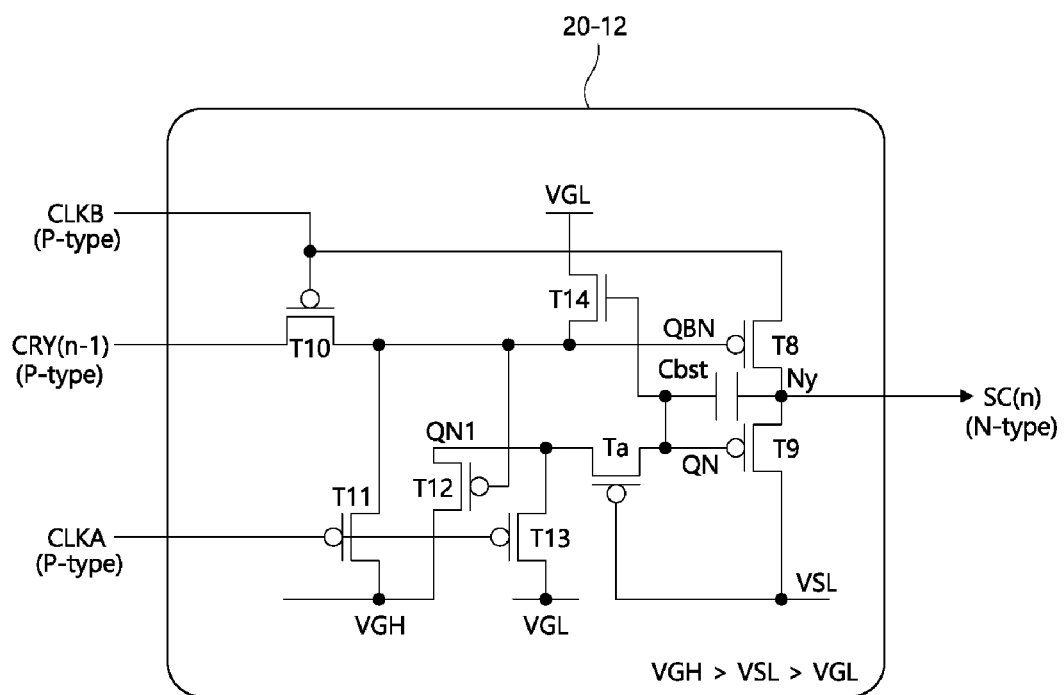

FIG. 22 is a diagram showing a twelfth embodiment of a scan generating circuit connected to a carry generating circuit in a gate stage.

Referring to FIG. 22, a scan generating circuit 20-12 according to the twelfth embodiment may include a plurality of P-type LTPS transistors T8 to T13 and Ta and a bootstrapping capacitor Cbst, and moreover, may generate a scan signal SC(n) which is an N-type pulse and may output the scan signal SC(n) to a gate line through a scan output node Ny.

Comparing with the scan generating circuit 20-10 of FIG. 20, the scan generating circuit 20-12 according to the twelfth embodiment may have a difference in that the scan generating circuit 20-12 further includes an eighth transistor T14 connected to a first scan control node QBN. Except for the eighth transistor T14, the other elements of the scan generating circuit 20-12 according to the twelfth embodiment may be substantially the same as those of the scan generating circuit 20-10 of FIG. 20.

A gate electrode of the eighth transistor T14 may be connected to a second scan control node QN, a first electrode of the seventh transistor T14 may be connected to the first scan control node QBN, and a second electrode of the eighth transistor T14 may be connected to an input terminal for a gate low voltage VGL. The eighth transistor T14 may be implemented as an N-type oxide transistor for stabilizing a voltage of the first scan control node QBN.

Referring to a driving waveform of FIG. 23, a voltage of the first scan control node QBN may be decreased to the gate low voltage VGL by a first carry signal CRY(n-1) of the gate low voltage VGL which is input in synchronization with a first pulse (i.e., a gate low voltage having an on level) of a second clock signal CLKB. At this time, as a fifth transistor T12 and a seventh transistor Ta are turned on, a voltage of a second scan control node QN may increase to a gate high voltage VGH. The eighth transistor T14 may maintain a turn-on state on the basis of the gate high voltage VGH of the second scan control node QN after the second clock signal CLKB is inverted from an on level (i.e., a gate low voltage) to an off level (i.e., a gate high voltage), and thus, may stably maintain the gate low voltage VGL of the first scan control node QBN for a predetermined time.

In the gate driver and the electroluminescent display apparatus including the same according to the embodiments of the present disclosure, a configuration of a gate stage may be simplified, and thus, a bezel size of a display panel may decrease, thereby reducing distortion of a scan signal.

The effects according to the present disclosure are not limited to the above examples, and other various effects may be included in the specification.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. An electroluminescent display apparatus comprising:
   a pixel including a driving transistor, an organic light emitting diode connected to the driving transistor, and at least one switching transistor having a semiconductor layer different from a semiconductor layer of the driving transistor and connected to the driving transistor; and
   a gate stage connected to the pixel through a gate line and supplying a scan signal to a gate electrode of the switching transistor;
   wherein the gate stage includes a scan generating circuit configured to generate the scan signal and a carry generating circuit configured to generate a carry signal by sharing a first clock signal and a second clock signal having different phases with the scan generating circuit, and
   wherein the carry generating circuit includes:
   a carry output node through which the carry signal is output;
   a first carry transistor connected between an input terminal of the first clock signal and the carry output node and turned on or off according to a voltage of a first carry control node;
   a second carry transistor connected between the carry output node and an input terminal of a gate high voltage and turned on or off according to a voltage of a second carry control node;
   a node controller configured to control a voltage of the first carry control node and a voltage of the second carry control node based on the first clock signal and the second clock signal;
   a first carry capacitor connected to the first carry control node and the carry output node; and
   a second carry capacitor connected to the second carry control node and the input terminal of the gate high voltage.

2. The electroluminescent display apparatus of claim 1, wherein the semiconductor layer of the driving transistor is implemented with low-temperature polysilicon, and the semiconductor layer of the at least one switching transistor is implemented with oxide.

3. The electroluminescent display apparatus of claim 1, wherein each of the first clock signal, the second clock signal, and the carry signal is a P-type pulse where a voltage of a pulse interval is lower than a voltage of a non-pulse interval, and
   the scan signal is an N-type pulse where the voltage of the pulse interval is higher than the voltage of the non-pulse interval.

4. The electroluminescent display apparatus of claim 1, wherein a pulse width of the scan signal is determined based on a pulse width of the first clock signal and a pulse width of the second clock signal.

5. The electroluminescent display apparatus of claim 1, wherein a pulse width of the scan signal is determined to be inversely proportional to a pulse width of the first clock signal and a pulse width of the second clock signal.

6. The electroluminescent display apparatus of claim 1, wherein a pulse interval of the scan signal is the same as an overlap interval between a non-pulse interval of the first clock signal and a non-pulse interval of the second clock signal.

7. The electroluminescent display apparatus of claim 1, wherein a pulse interval of the scan signal is an interval between a rising edge of the first clock signal and a falling edge of the second clock signal, and
   the rising edge of the first clock signal and the falling edge of the second clock signal are adjacent to each other.

8. The electroluminescent display apparatus of claim 1, wherein each of the carry generating circuit and the scan generating circuit includes a plurality of low-temperature poly-silicon type transistors.

9. The electroluminescent display apparatus of claim 1, wherein the scan generating circuit comprises:
   a scan output node outputting the scan signal;
   a first transistor including a gate electrode connected to a first scan control node, a first electrode connected to an input terminal for the second clock signal, and a second electrode connected to the scan output node;
   a second transistor including a gate electrode connected to a second scan control node, a first electrode connected to the scan output node, and a second electrode connected to an input terminal for a gate low voltage;
   a third transistor including a gate electrode connected to the input terminal for the second clock signal, a first electrode connected to an input terminal for the first carry signal, and a second electrode connected to the first scan control node;
   a fourth transistor including a gate electrode connected to an input terminal for the first clock signal, a first electrode connected to the first scan control node, and a second electrode connected to an input terminal for a gate high voltage which is higher than the gate low voltage;
a fifth transistor including a gate electrode connected to the first scan control node, a first electrode connected to the second scan control node, and a second electrode connected to the input terminal for the gate high voltage; and
a sixth transistor including a gate electrode connected to an input terminal for the first clock signal, a first electrode connected to the second scan control node, and a second electrode connected to the input terminal for the gate low voltage.

10. The electroluminescent display apparatus of claim 9, wherein the scan generating circuit further comprises a stabilization capacitor including a first electrode connected to the first scan control node and a second node connected to a direct current (DC) voltage terminal, and
the DC voltage terminal is the input terminal for the gate high voltage or the input terminal for the gate low voltage.

11. The electroluminescent display apparatus of claim 9, wherein the scan generating circuit further comprises a seventh transistor including a gate electrode connected to the second scan control node, a first electrode connected to the first scan control node, and a second electrode connected to the input terminal for the gate low voltage.

12. The electroluminescent display apparatus of claim 9, wherein the scan generating circuit further comprises:
a bootstrapping capacitor including a first electrode connected to the scan output node and a second electrode connected to the second scan control node; and
a seventh transistor including a gate electrode connected to the input terminal for the gate low voltage, a first electrode connected to the second scan control node, and a second electrode connected to the second electrodes of the fifth transistor and the sixth transistor,
wherein a semiconductor type of the seventh transistor is different from a semiconductor type of each of the first to sixth transistors.

13. The electroluminescent display apparatus of claim 12, wherein the scan generating circuit further comprises a stabilization capacitor including a first electrode connected to the first scan control node and a second node connected to a direct current (DC) voltage terminal, and
the DC voltage terminal is the input terminal for the gate high voltage or the input terminal for the gate low voltage.

14. The electroluminescent display apparatus of claim 12, wherein the scan generating circuit further comprises an eighth transistor including a gate electrode connected to the second scan control node, a first electrode connected to the first scan control node, and a second electrode connected to the input terminal for the gate low voltage.

15. The electroluminescent display apparatus of claim 9, wherein the scan generating circuit further comprises:
a bootstrapping capacitor including a first electrode connected to the scan output node and a second electrode connected to the second scan control node; and
a seventh transistor including a gate electrode connected to an input terminal for a gate middle voltage, a first electrode connected to the second scan control node, and a second electrode connected to the second electrodes of the fifth transistor and the sixth transistor, and
the gate middle voltage is a voltage between the gate low voltage and the gate high voltage.

16. The electroluminescent display apparatus of claim 15, wherein the scan generating circuit further comprises a stabilization capacitor including a first electrode connected to the first scan control node and a second node connected to a direct current (DC) voltage terminal, and
the DC voltage terminal is the input terminal for the gate high voltage, the input terminal for the gate low voltage, or the input terminal for the gate middle voltage.

17. The electroluminescent display apparatus of claim 15, wherein the scan generating circuit further comprises an eighth transistor including a gate electrode connected to the second scan control node, a first electrode connected to the first scan control node, and a second electrode connected to the input terminal for the gate low voltage, and
wherein a semiconductor type of the eighth transistor is different from a semiconductor type of each of the first to seventh transistors.

18. The electroluminescent display apparatus of claim 1, wherein the scan generating circuit comprises:
a scan output node outputting the scan signal;
a first transistor including a gate electrode connected to a first scan control node, a first electrode connected to an input terminal for the second clock signal, and a second electrode connected to the scan output node;
a second transistor including a gate electrode connected to a second scan control node, a first electrode connected to the scan output node, and a second electrode connected to an input terminal for a gate middle voltage;
a third transistor including a gate electrode and a first electrode connected to the input terminal for the second clock signal and a second electrode connected to the first scan control node;
a fourth transistor including a gate electrode connected to an input terminal for the first clock signal, a first electrode connected to the first scan control node, and a second electrode connected to an input terminal for a gate high voltage which is higher than the gate middle voltage;
a fifth transistor including a gate electrode connected to the first scan control node, a first electrode connected to a secondary node, and a second electrode connected to the input terminal for the gate high voltage;
a sixth transistor including a gate electrode connected to an input terminal for the first clock signal, a first electrode connected to the secondary node, and a second electrode connected to an input terminal for a gate low voltage which is lower than the gate middle voltage;
a bootstrapping capacitor including a first electrode connected to the scan output node and a second electrode connected to the second scan control node; and
a seventh transistor including a gate electrode connected to the input terminal for the gate middle voltage, a first electrode connected to the second scan control node, and a second electrode connected to the secondary node.

19. The electroluminescent display apparatus of claim 18, wherein the scan generating circuit further comprises a stabilization capacitor including a first electrode connected to the first scan control node and a second node connected to a direct current (DC) voltage terminal, and
the DC voltage terminal is the input terminal for the gate high voltage, the input terminal for the gate low voltage, or the input terminal for the gate middle voltage.

20. The electroluminescent display apparatus of claim 19, the scan generating circuit further comprises an eighth transistor including a gate electrode connected to the second scan control node, a first electrode connected to the first scan control node, and a second electrode connected to the input terminal for the gate low voltage, and wherein a semiconductor type of the eighth transistor is different from a semiconductor type of each of the first to seventh transistors.

\* \* \* \* \*